United States Patent
Fujimura et al.

(10) Patent No.: US 8,020,135 B2
(45) Date of Patent: Sep. 13, 2011

(54) MANUFACTURING AWARE DESIGN AND DESIGN AWARE MANUFACTURING OF AN INTEGRATED CIRCUIT

(75) Inventors: Akira Fujimura, Saratoga, CA (US); Louis K. Scheffer, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 493 days.

(21) Appl. No.: 12/136,044

(22) Filed: Jun. 9, 2008

(65) Prior Publication Data

US 2008/0307371 A1 Dec. 11, 2008

Related U.S. Application Data

(62) Division of application No. 11/214,472, filed on Aug. 28, 2005, now Pat. No. 7,395,516.

(60) Provisional application No. 60/683,440, filed on May 20, 2005.

(51) Int. Cl.
*G06F 7/58* (2006.01)
*G06F 9/45* (2006.01)
*G06F 17/50* (2006.01)

(52) U.S. Cl. ........ 716/126; 716/106; 716/110; 716/111; 716/129; 716/130; 716/136; 716/137; 716/139; 703/14; 703/22

(58) Field of Classification Search .................. 716/1–18
See application file for complete search history.

(56) References Cited

U.S. PATENT DOCUMENTS

| | | |
|---|---|---|
| 5,923,562 A | 7/1999 | Liebmann et al. |
| 6,069,350 A | 5/2000 | Ohtsuka et al. |
| 6,269,470 B1 | 7/2001 | Paz |
| 6,303,276 B1 | 10/2001 | Savant et al. |
| 6,370,441 B1 * | 4/2002 | Ohnuma ...................... 700/121 |
| 6,388,736 B1 | 5/2002 | Smith et al. |
| 6,466,304 B1 | 10/2002 | Smith |
| 6,516,450 B1 | 2/2003 | Hill et al. |
| 6,553,562 B2 | 4/2003 | Capodieci et al. |
| 6,577,994 B1 | 6/2003 | Tsukuda |

(Continued)

FOREIGN PATENT DOCUMENTS

EP 1889195 2/2008

(Continued)

OTHER PUBLICATIONS

Non-Final Office Action of U.S. Appl. No. 11/419,495, Sep. 26, 2008 (mailing date), Louis K. Scheffer et al.

(Continued)

*Primary Examiner* — Helen Rossoshek
(74) *Attorney, Agent, or Firm* — Adeli & Tollen LLP

(57) ABSTRACT

Some embodiments of the invention provide a process for designing and manufacturing an integrated circuit ("IC"). The process selects a wiring configuration and an illumination configuration. The process uses the selected wiring configuration to design an IC layout. The process then uses the selected illumination configuration to manufacture the IC based on the designed IC layout. Some embodiments select a wiring configuration based on the selected illumination configuration. In some embodiments, selecting the illumination configuration entails selecting at least one stepper lens for the IC layout, where the stepper lens illuminates at least one mask for at least one particular layer of the IC layout. Also, in some embodiments, selecting the wiring configuration entails defining the width and/or spacing of the routes along different directions on at least one particular wiring layer of the IC layout.

34 Claims, 22 Drawing Sheets

U.S. PATENT DOCUMENTS

| | | | |
|---|---|---|---|
| 6,775,818 B2 * | 8/2004 | Taravade et al. | 716/53 |
| 6,779,165 B2 * | 8/2004 | Darden | 716/12 |
| 6,789,232 B1 * | 9/2004 | Iyer et al. | 716/1 |
| 6,792,587 B2 * | 9/2004 | Xing et al. | 716/129 |
| 6,804,809 B1 | 10/2004 | West et al. | |
| 6,829,753 B2 * | 12/2004 | Lee et al. | 716/5 |
| 6,855,486 B1 | 2/2005 | Finders et al. | |
| 6,871,338 B2 | 3/2005 | Yamauchi | |
| 6,915,252 B1 | 7/2005 | Li | |
| 6,915,505 B2 | 7/2005 | Hsu et al. | |
| 7,000,205 B2 | 2/2006 | Devgan et al. | |
| 7,000,207 B2 | 2/2006 | Gothoskar et al. | |
| 7,030,966 B2 | 4/2006 | Hansen | |
| 7,051,314 B2 * | 5/2006 | Goto | 430/30 |
| 7,079,223 B2 | 7/2006 | Rosenbluth et al. | |
| 7,096,447 B1 | 8/2006 | Li et al. | |
| 7,138,212 B2 | 11/2006 | Hsu et al. | |
| 7,174,520 B2 | 2/2007 | White et al. | |
| 7,241,539 B2 | 7/2007 | Kim et al. | |
| 7,269,804 B2 * | 9/2007 | Tabery et al. | 716/53 |
| 7,395,516 B2 | 7/2008 | Fujimura et al. | |
| 7,627,847 B1 * | 12/2009 | Scheffer | 716/12 |
| 7,712,064 B2 | 5/2010 | Scheffer et al. | |
| 7,814,456 B2 * | 10/2010 | Gupta et al. | 716/100 |
| 2002/0108097 A1 * | 8/2002 | Harris et al. | 716/11 |
| 2003/0198872 A1 | 10/2003 | Yamazoe et al. | |
| 2004/0015794 A1 | 1/2004 | Kotani et al. | |
| 2004/0029024 A1 | 2/2004 | Ohnuma | |
| 2004/0121244 A1 | 6/2004 | Misaka | |
| 2005/0005257 A1 | 1/2005 | Eurlings et al. | |
| 2005/0044514 A1 | 2/2005 | Wu et al. | |
| 2005/0076316 A1 * | 4/2005 | Pierrat et al. | 716/4 |
| 2005/0102648 A1 | 5/2005 | Hsu et al. | |
| 2005/0138598 A1 | 6/2005 | Kokubun | |
| 2005/0216877 A1 | 9/2005 | Pack et al. | |
| 2005/0251771 A1 * | 11/2005 | Robles | 716/5 |
| 2005/0283747 A1 | 12/2005 | Adam | |
| 2006/0046168 A1 | 3/2006 | Fukuhara | |
| 2006/0066855 A1 | 3/2006 | Boef et al. | |
| 2006/0090146 A1 | 4/2006 | LeBritton et al. | |
| 2006/0177747 A1 | 8/2006 | Misaka | |
| 2006/0265679 A1 | 11/2006 | Scheffer et al. | |
| 2006/0271907 A1 * | 11/2006 | Izuha et al. | 716/21 |
| 2007/0094623 A1 | 4/2007 | Chen et al. | |
| 2007/0220476 A1 * | 9/2007 | Mukherjee et al. | 716/18 |
| 2010/0180247 A1 | 7/2010 | Scheffer et al. | |

FOREIGN PATENT DOCUMENTS

| | | |
|---|---|---|
| WO | WO 2006/127538 | 11/2006 |

OTHER PUBLICATIONS

Restriction Requirement of U.S. Appl. No. 11/419,495, Jul. 3, 2008 (mailing date), Louis K. Scheffer et al.

Kong, "CAD for Nanometer Silicon Design Challenges and Success," Nov. 2004, Very Large Scale Integration (VLSI) Systems, IEEE Transactions on, vol. 12, Issue 11, pp. 1132-1147.

Restriction Requirement of U.S. Appl. No. 11/419,495, Nov. 3, 2006 (mailing date), Fujimura et al.

Restriction Requirement of U.S. Appl. No. 11/214,472, Nov. 3, 2006 (mailing date), Fujimura et al.

Non-Final Office Action of U.S. Appl. No. 11/214,472, Feb. 14, 2007 (mailing date), Fujimura et al.

Final Office Action of U.S. Appl. No. 11/214,472, Aug. 31, 2007 (mailing date), Fujimura et al.

Notice of Allowance of U.S. Appl. No. 11/214,472, Feb. 19, 2008 (mailing date), Fujimura et al.

International Search Report and Written Opinion of PCT/US2006/019624, Jan. 11, 2007 (mailing date), Cadence Design Systems, Inc.

International Preliminary Report on Patentability of PCT/US2006/019624, Nov. 23, 2007, Cadence Design Systems, Inc.

Gupta, et al., "Manufacturing-aware physical design", Computer Aided design, ICCAD-2003. International Conference on pp. 681-687, Nov. 9-13, 2003.

Updated portions of prosecution history of U.S. Appl. No. 11/214,472, May 19, 2008, Fujimura, Akira, et al., now issued U.S. Appl. No. 7,395,516.

Updated portions of prosecution history of U.S. Appl. No. 11/419,495, Mar. 1, 2010, Scheffer, Louis K., et al., now issued U.S. Appl. No. 7,712,064.

Portions of prosecution history of U.S. Appl. No. 12/731,118, Nov. 22, 2010, Scheffer, Louis K., et al.

* cited by examiner

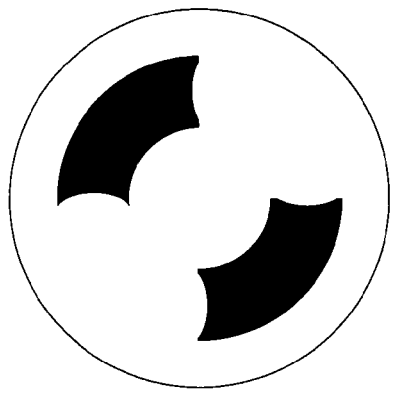
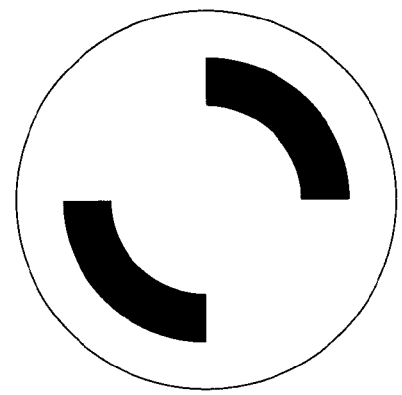
Figure 10                    Figure 11
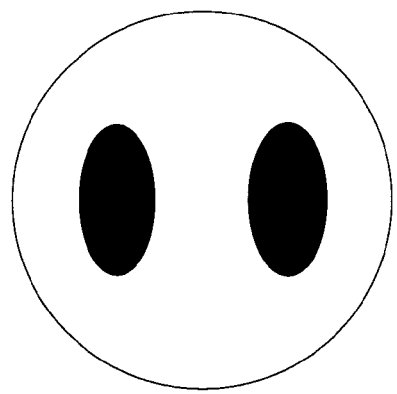
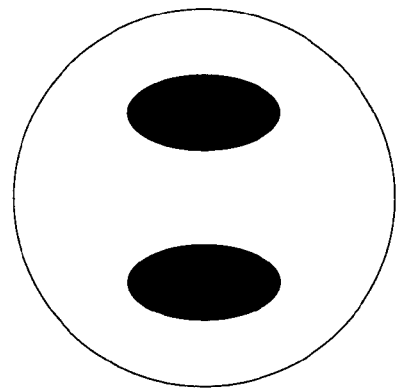
Figure 12                    Figure 13

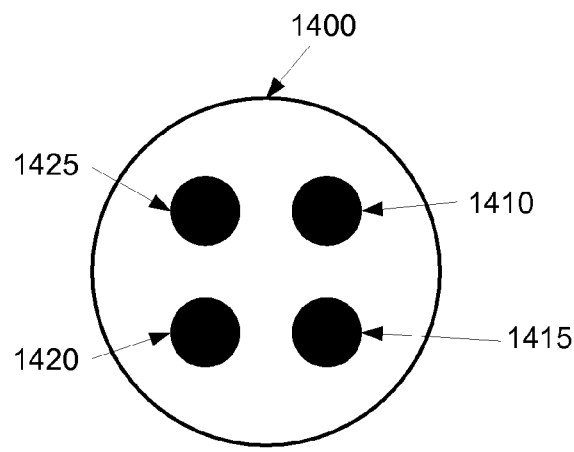
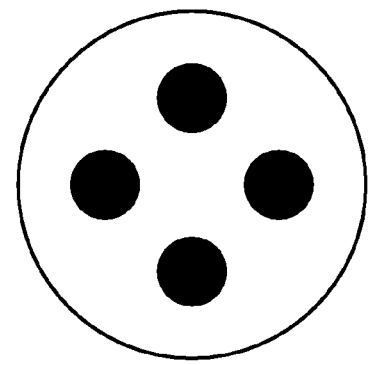
Figure 14
Figure 15
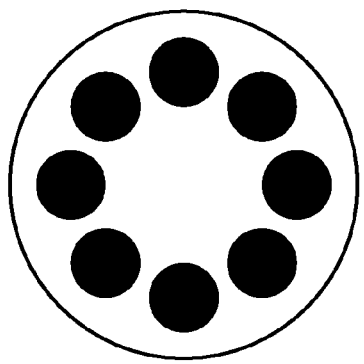
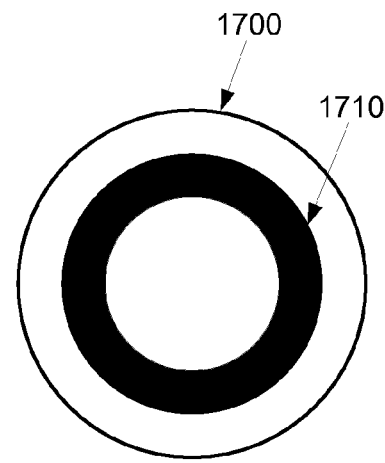
Figure 16
Figure 17

MANUFACTURING AWARE DESIGN AND DESIGN AWARE MANUFACTURING OF AN INTEGRATED CIRCUIT

CLAIM OF BENEFIT TO PRIOR APPLICATIONS

This application is a divisional application of U.S. Non-Provisional patent application Ser. No. 11/214,472, filed Aug. 28, 2005 now U.S. Pat. No. 7,395,516, entitled "Manufacturing Aware Design and Design Aware Manufacturing," now issued as U.S. Pat. No. 7,395,516. U.S. patent application Ser. No. 11/214,472 claims priority to U.S. Provisional Patent Application 60/683,440, filed May 20, 2005, entitled "Method and System for Increasing the Yield of Integrated Circuit Manufacturing". U.S. patent application Ser. No. 11/214,472, now issued as U.S. Pat. No. 7,395,516 and U.S. Provisional Patent Application 60/683,440, are incorporated herein by reference.

FIELD OF THE INVENTION

The present invention is directed towards manufacturing aware design and design aware manufacturing.

BACKGROUND OF THE INVENTION

An integrated circuit ("IC") is a device (e.g., a semiconductor device) that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components. Traditionally, IC's use preferred direction ("PD") wiring models, which specify a preferred wiring direction for each of their wiring layers. In preferred direction wiring models, the preferred direction typically alternates between successive wiring layers.

One example of a PD wiring model is the PD Manhattan wiring model, which specifies alternating layers of preferred-direction horizontal and vertical wiring. Another example of a PD wiring model is the PD diagonal wiring model, which specifies alternating layers of preferred-direction diagonal wiring. The PD diagonal wiring model can allow for shorter wiring distances than the PD Manhattan wiring model and can decrease the total wirelength needed to interconnect the electronic and circuit components of an IC.

Design engineers design IC's by transforming logical or circuit descriptions of the IC's components into geometric descriptions, called layouts. IC layouts typically include (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. To create layouts, design engineers typically use electronic design automation ("EDA") applications. These applications provide sets of computer-based tools for creating, editing, and analyzing IC design layouts.

One EDA tool is a router that defines routes (i.e., interconnect geometries) that connect the pins of nets. Routers usually generate routes that traverse in the Manhattan direction. Some recent routers generate routes that traverse in the Manhattan and diagonal directions. These routers are typically not aware of manufacturing constraints. Similarly most manufacturing processes are not aware of constraints used to design an IC. As such, there is a need to have a manufacturing method that is aware of constraints used to design an IC. Furthermore, there is a need for a design method that is aware of constraints used during manufacturing processes.

SUMMARY OF THE INVENTION

Some embodiments of the invention provide a process for designing and manufacturing an integrated circuit ("IC"). The process selects a wiring configuration and an illumination configuration. The process uses the selected wiring configuration to design an IC layout. The process then uses the selected illumination configuration to manufacture the IC based on the designed IC layout.

Some embodiments concurrently select an optimal pair of wiring and illumination configurations. Other embodiments select an illumination configuration based on the selected wiring configuration. Yet other embodiments select a wiring configuration based on the selected illumination configuration. In some embodiments, selecting the illumination configuration entails selecting at least one stepper lens for the IC layout, where the stepper lens illuminates at least one mask for at least one particular layer of the IC layout. In some embodiments, this selection entails selecting a stepper lens for each particular layer of the IC layout. Also, in some embodiments, selecting the wiring configuration entails defining the width and/or spacing of the routes along different directions on at least one particular wiring layer of the IC layout. In some embodiments, this selection entails selecting width and/or spacing of routes along different directions on each particular layer of the IC layout. In some of these embodiments, the selected width and/or spacing along different directions on each particular layer can be different.

BRIEF DESCRIPTION OF THE DRAWINGS

The novel features of the invention are set forth in the appended claims. However, for purpose of explanation, several embodiments of the invention are set forth in the following figures.

FIG. 10 illustrates a stepper lens used during an illumination operation.

FIG. 11 illustrates another stepper lens used during an illumination operation.

FIG. 12 illustrates yet another lens used during an illumination operation.

FIG. 13 illustrates an alternative lens used during an illumination operation.

FIG. 14 illustrates a quadrupole lens used during an illumination operation.

FIG. 15 illustrates another quadrupole lens used during an illumination operation.

FIG. 16 illustrates an octagonal lens used during an illumination operation.

FIG. 17 illustrates an annular lens used during an illumination operation.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide a process for designing and manufacturing an integrated circuit ("IC"). The process selects a wiring configuration and an illumination configuration. The process uses the selected wiring configuration to design an IC layout. The process then uses the selected illumination configuration to manufacture the IC based on the designed IC layout.

Some embodiments concurrently select an optimal pair of wiring and illumination configurations. Other embodiments select an illumination configuration based on the selected wiring configuration. Yet other embodiments select a wiring configuration based on the selected illumination configuration. In some embodiments, selecting the illumination configuration entails selecting at least one stepper lens for the IC layout, where the stepper lens illuminates at least one mask for at least one particular layer of the IC layout. In some embodiments, this selection entails selecting a stepper lens for each particular layer of the IC layout. Also, in some embodiments, selecting the wiring configuration entails defining the width and/or spacing of the routes along different directions on at least one particular wiring layer of the IC layout. In some embodiments, this selection entails selecting width and/or spacing of routes along different directions on each particular layer of the IC layout. In some of these embodiments, the selected width and/or spacing along different directions on each particular layer can be different.

Before describing in detail the design and manufacturing processes of some embodiments, the wiring model, lithography processes and various illumination configurations that are used by some embodiments will first be described below.

I. Illumination Operation and Configuration

A. Wiring Models

Figure 1:
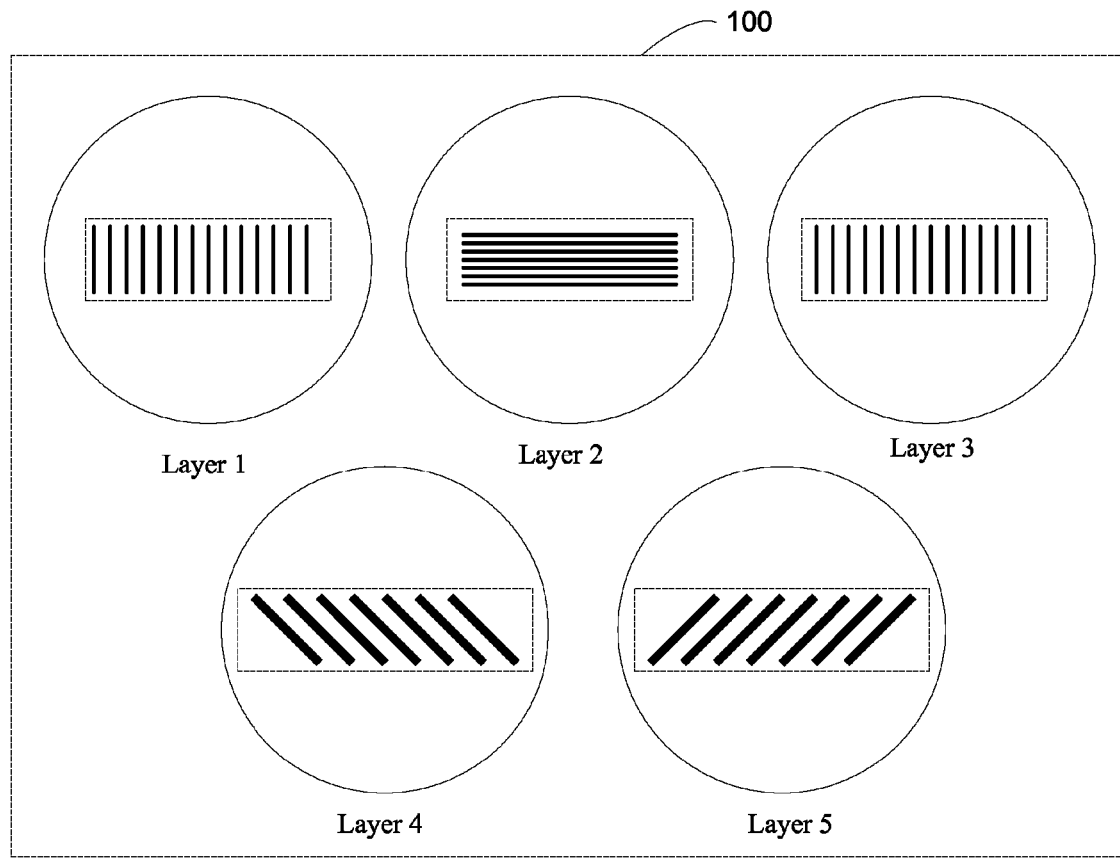
FIG. 1 illustrates different routes with different widths on different layers of an IC layout.

Different embodiments use different wiring models. FIG. 1 illustrates an example of a five-layer wiring model 100 used in some embodiments. As shown in this figure, layer 1 has a vertical preferred direction, layer 2 has a horizontal preferred direction, layer 3 has a vertical preferred direction, layer 4 has a 135° diagonal preferred direction, and layer 5 has a 45° diagonal preferred direction. As further shown in FIG. 1, the diagonal wiring on layers 4 and 5 have wider widths than the Manhattan wiring in layers 1, 2 and 3.

Figure 2:
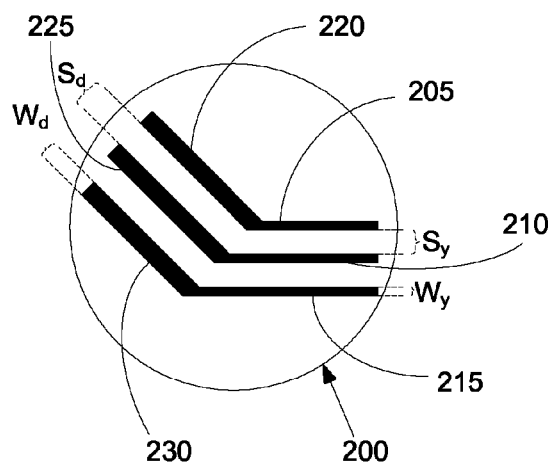
FIG. 2 illustrates routes with different widths on a layer of an IC layout.
Figure 3:
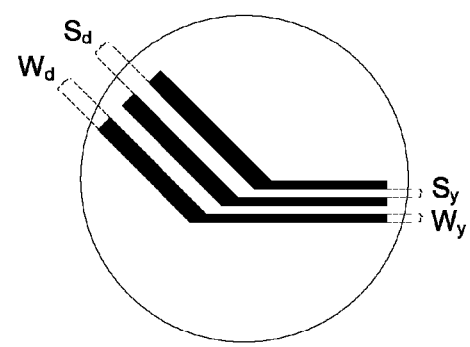
FIG. 3 illustrates other routes with different widths on a layer of an IC layout.

As illustrated in FIG. 2, some wiring models have different widths and/or spacing for routes along different directions on the same layer of the layout. As shown in this figure, the layer 200 has horizontal route segments 205-215, each having a width $W_y$. The layer 200 also has diagonal route segments 220-230, each having a width $W_d$. In this illustration, the width $W_d$ is wider than the width $W_y$. The spacing between the horizontal route segments 205-215 is represented by $S_y$. The spacing between the diagonal route segments 220-230 is represented by $S_d$. In this illustration, the spacing $S_d$ is wider than the spacing $S_y$. In other wiring models, the spacing $S_d$ is the same as the spacing $S_y$, as shown in FIG. 3.

B. Lithography Process

Figure 4:
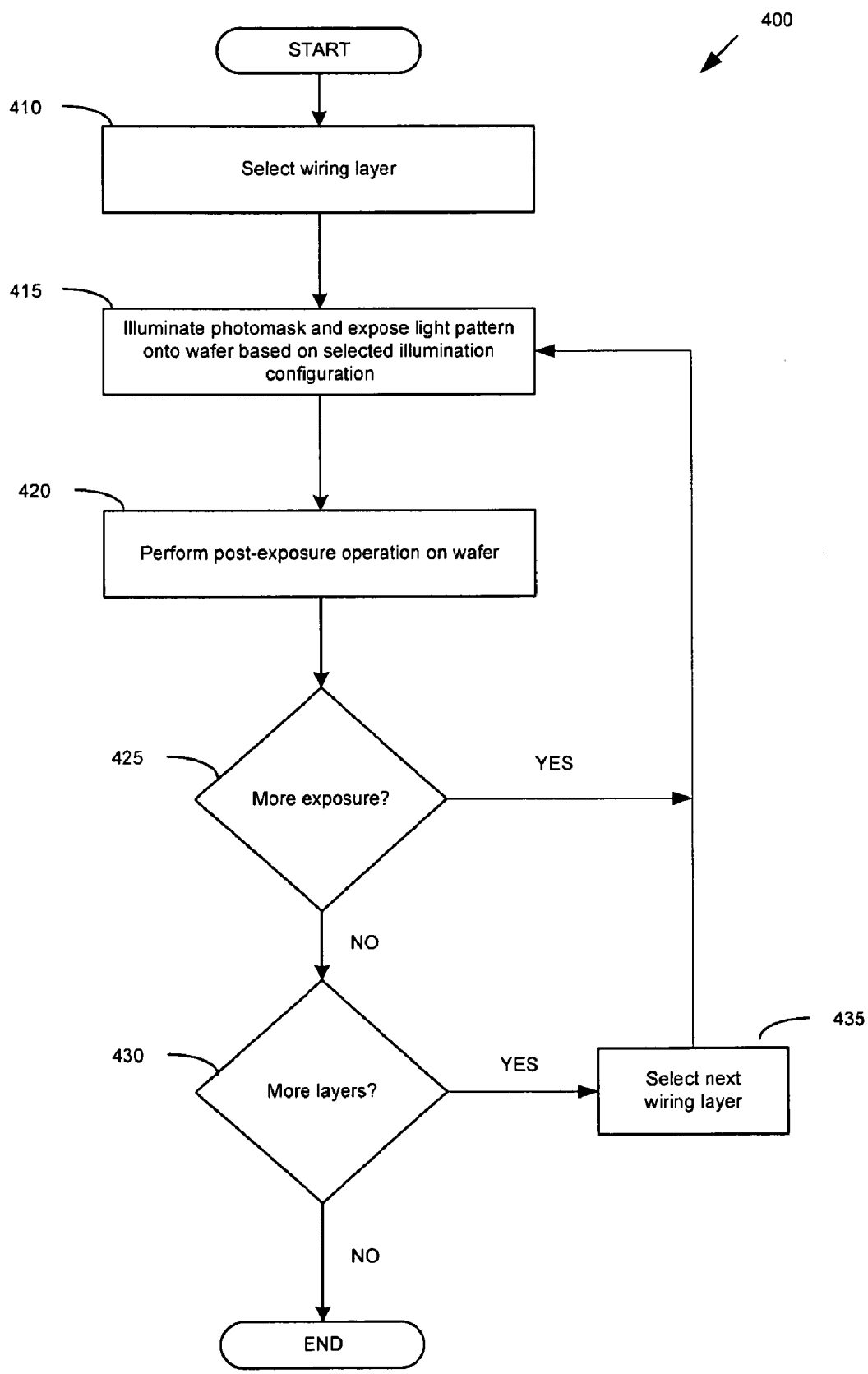
FIG. 4 illustrates a process of design aware manufacturing of an IC using a lithography process.

FIG. 4 illustrates a lithography process 400 that some embodiments use to create an IC. As shown in this figure, a selection operation 410 is the first operation of the lithography process 400. During the selection operation 410, a wiring layer of the IC layout is selected. The operation that follows the selection operation 410 in the lithography process 400 is an illumination operation 415. The illumination operation 415 entails illuminating a mask, which exposes a light pattern onto a wafer. The illuminated mask defines certain components or interconnects of the IC on the selected layer. The illumination operation 415 is based on a selected illumination configuration, which will be further described.

After the illumination operation 415 of the lithography process 400, a post-exposure operation 420 is performed. Different embodiments perform different post-exposure operations. In some embodiments, the post-exposure operation 420 includes rinsing and etching operations. The rinsing operation entails rinsing away any area of a photoresist layer of the wafer that is exposed to the light pattern. This rinsing operation leaves an imprinted pattern of the mask on the photoresist layer of the wafer. Once the exposed area of the photoresist layer is rinsed away, an etching operation is performed on the wafer. During the etching operation, any area of the wafer that is unprotected by the photoresist layer is exposed to gases. The gases remove the exposed area of wafer, thereby producing the IC components of the desired circuit pattern.

The operation that follows the post-exposure operation 420 is an exposure determination operation 425. The exposure determination operation 425 entails determining whether any additional exposure is required on the selected layer. If additional exposure is required, the next operation is the illumination operation 415, where another mask is illuminated based on the selected illumination configuration for the next exposure. For example, additional exposure is required if double dipole illumination is selected (which is described below). If no additional exposure is required, then the next operation of the lithography process 400 is a layer determination operation 430. In some embodiments, the lithography process 400 does not include the exposure determination operation 425 and thus the next operation after the post-exposure operation 420 is the layer determination operation 430.

The layer determination operation 430 entails determining if there is an additional layer. If there is no additional layer, the lithography process 400 ends. However, if there is an additional layer, the next operation is a layer selection operation 435. This operation entails selecting the next wiring layer. The illumination operation 415 follows the layer selection operation 435. As described above, this illumination operation 415 entails selecting an illumination configuration for the next wiring layer. In some embodiments, the lithography process 400 does not include the layer determination operation 430.

In some embodiments, the lithography process 400 is performed by using multiple machines of a production line manufacturing process used to create each layer of all the ICs. In this process, each machine of the production line has a particular illumination configuration (e.g., particular stepper lens). This production line manufacturing process is dedicated to manufacture only one layer of the all ICs that are produced by using this production line. Some embodiments perform the lithography process 400 by using a production line manufacturing process that includes one or more machines that are modified during the manufacturing process by changing the stepper lens.

C. Illumination Configuration

Figure 5:
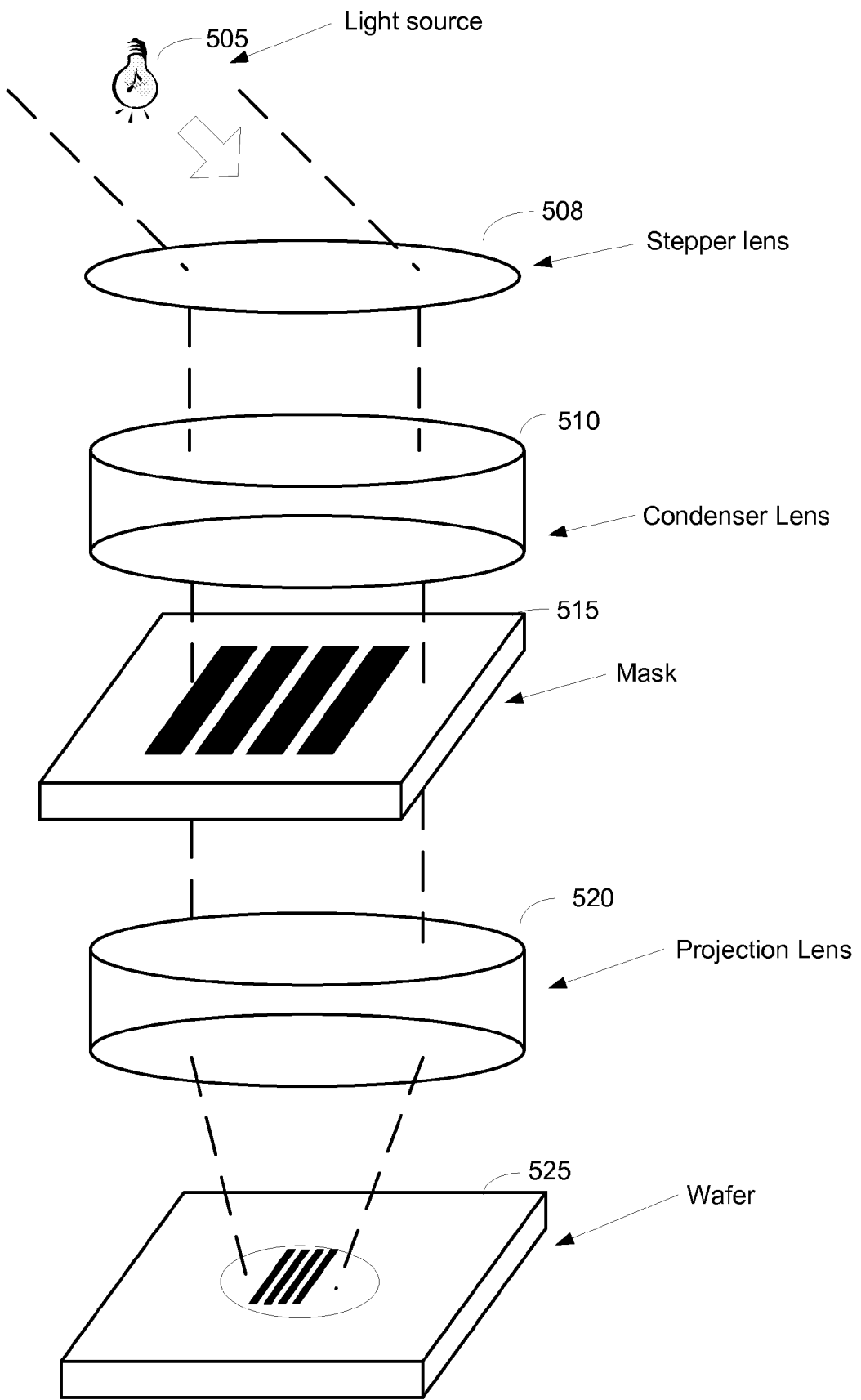
FIG. 5 illustrates the process of off-axis illumination of a mask onto a wafer.

An illumination configuration is an arrangement of illumination components that can perform an illumination operation. FIG. 5 illustrates an example of an illumination configuration that is used to perform an illumination operation 415 during the lithography process 400 described above. This illumination configuration includes a light source 505, a stepper lens 508, a condenser lens 510, a mask 515, a projection lens 520 and a wafer 525.

As shown in FIG. 5, the light source 505 is shifted away from a normal incidence. When the light source 505 is shifted in such a manner, the light coming from the light source 505 strikes a lens at an angle away from normal incidence (i.e., striking the lens away from a perpendicular angle). In this configuration, the particular lens is the stepper lens 508. The function of the stepper lens 508 in this configuration is to shape the light pattern that strikes the mask 515. Additionally, the stepper lens 508 reduces the light pattern sensitivity to lens aberrations, such as image placement error.

Once the light passes through the stepper lens 508, it passes through a condenser lens 510. The condenser lens 510 focuses the light through the mask 515. Any light that passes through the mask 515 creates a light pattern. The light pattern then passes through a projection lens 520. This passing focuses the light and reduces the light by a factor (e.g., four). The focused and reduced light pattern then projects onto a wafer 525.

The configuration illustrated in FIG. 5 is referred to as an off-axis illumination configuration. The term "off-axis" refers to when the light source 505 is shifted away from normal incidence. However, one skilled in the art will realize that different embodiments might use different illumination configurations with different components. Also, different embodiments might use different types of stepper lenses. Stepper lenses will now be further described.

D. Stepper Lenses

As described above, a stepper lens reduces light placement error in certain directions during the illumination operation 415. The stepper lens achieves this result (i.e., reducing light placement error) by shaping the light that illuminates a mask. This, in turn, shapes the light pattern that is projected onto the wafer.

By shaping the light pattern that is projected onto the wafer, a particular stepper lens more reliably produces wires (i.e., produces "accurate wires") in a first set of direction or directions than in a second set of direction or directions. Specifically, in the first set of directions, the wires have widths and/or spacing that are more consistently reproduced within an acceptable range (e.g., variation) of the desired widths and/or spacing than the wires in the second set of directions.

Different stepper lenses reduce light placement error differently, and therefore differently shape the light pattern that is projected onto the wafer. Accordingly, different stepper lenses produce accurate wires in different directions. For instance, a first stepper lens more reliably produces wires in a first direction than it produces wires in a second direction, while a second stepper lens reliably produces wires in the second direction than it produces wires in the first direction. By way of example, a stepper lens might reduce light placement error along the vertical direction during the illumination operation 415. Such a stepper lens might therefore reliably produce accurate wires (i.e., wires with low variations in width and/or spacing) along the vertical direction on the layer of the IC, but produce non-accurate wires in the horizontal direction on the layer of the IC. Another stepper lens, on the other hand, might reduce light placement error along the horizontal direction during the illumination operation 415. Such a stepper lens might therefore reliably produce accurate wires (i.e., wires with low variations in width and/or spacing) along the horizontal direction on the layer of the IC, but produce non-accurate wires in the vertical direction on the layer of the IC.

FIGS. 6-9 illustrate examples of dipole lenses. A dipole lens is a type of a stepper lens that can be used in an illumination configuration. As shown in these figures, a dipole lens has two apertures, called poles. These poles are aligned in a particular direction (e.g., vertical, horizontal, diagonal), which is referred below. These poles provide openings through which light emanating from a light source can strike a mask. When these dipole lenses are used in the illumination operation 415, they can produce wire segments in numerous directions.

Additionally, a dipole lens reduces light placement error along a direction that is perpendicular to the alignment of the poles of the dipole lens. As such, a dipole lens reliably produces wire segments that have width and spacing that are close to a desired width and spacing (i.e., accurate) in a direction that is perpendicular to the alignment of the poles of the dipole lens. However, in other directions, these dipole lenses do not reliably produce wire segments that have width and spacing that are close to the desired width and spacing (i.e., wires that are not accurate).

Figure 6:
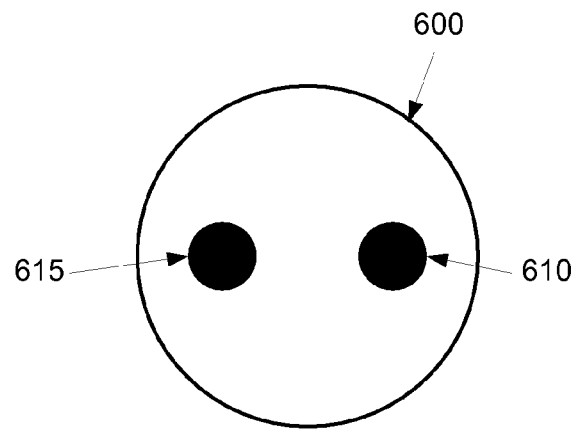
FIG. 6 illustrates a 180° dipole lens used during an illumination operation.

FIG. 6 illustrates a dipole lens 600. The dipole lens 600 has two poles 610 and 615. The two poles 610 and 615 of the dipole lens 600 are aligned in the horizontal direction. The horizontally aligned dipole lens 600 consistently produces accurate vertically aligned wire segments (i.e., width and spacing of wire segments are close to a desired width and spacing on a consistent basis). However, in the non-vertical directions (e.g., horizontal, diagonal), the horizontally aligned dipole lens 600 produces wire segments that are not as accurate (i.e., width and spacing of wire segments are not as close to a desired width and spacing on a consistent basis).

Figure 18:
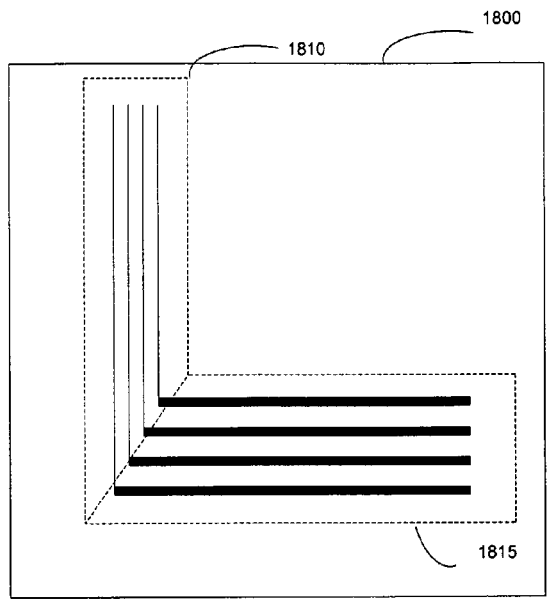
FIG. 18 illustrates a layer of an IC with vertically aligned wires that have narrow width and spacing.

FIG. 18 illustrates an example of an IC manufactured using the horizontally aligned dipole lens 600. As shown in this figure, the vertical wire segments 1810 have accurate width and spacing, while the width and spacing of the horizontal wire segments 1815 are not as accurate. In this figure, the vertical wire segments 1810 are accurate because the width and spacing of the vertical wire segments 1810 are narrow (therefore showing that the vertical wire segments 1810 have low variations in their width and spacing). On the other hand, the horizontal wire segments 1815 are not as accurate because the width and spacing of the horizontal wire segments 1815 are wide (therefore showing that the horizontal wire segments 1815 have high variations in their width and spacing).

Figure 7:
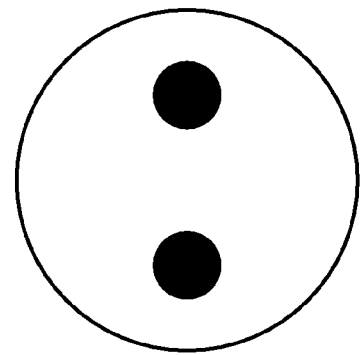
FIG. 7 illustrates a 90° dipole lens used during an illumination operation.

FIG. 7 illustrates another dipole lens 600. The dipole lens 600 has two poles 610 and 615. The two poles 610 and 615 of the dipole lens 600 are aligned in the vertical direction. The vertically aligned dipole lens 600 consistently produces accurate horizontally aligned wire segments. However, in the non-horizontal directions (e.g., vertical, diagonal), the vertically aligned dipole lens 600 produces wires segments that are not as accurate (i.e., width and/or spacing of wire segments not reliably reproduced).

Figure 19:
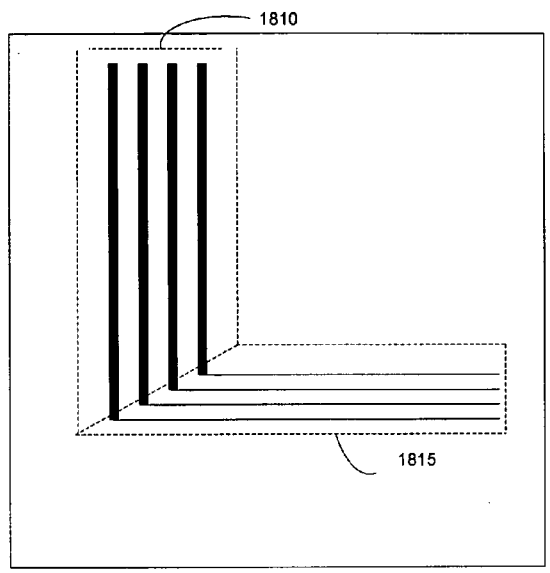
FIG. 19 illustrates a layer of an IC with horizontally aligned wires that have narrow width and spacing.

FIG. 19 illustrates an example of an IC manufactured using the vertically aligned dipole lens 600. As shown in this figure, the horizontal wire segments 1815 have accurate width and spacing, while the width and spacing of the vertical wire segments 1810 are not as accurate. In this figure, the horizontal wire segments 1815 are accurate because the width and spacing of the horizontal wire segments 1815 are narrow (therefore showing that the horizontal wire segments 1815 have low variations in their width and spacing). In contrast, the vertical wire segments 1810 are not as accurate because the width and spacing of the vertical wire segments 1810 are wide (therefore showing that the vertical wire segments 1810 have high variations in their width and spacing).

Figure 8:
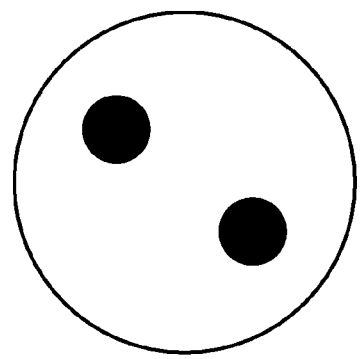
FIG. 8 illustrates a 135° dipole lens used during an illumination operation.

FIG. 8 illustrates another dipole lens 600. The dipole lens 600 has two poles 610 and 615. The two poles 610 and 615 of the dipole lens 600 are aligned in the 135° diagonally direction. The 135° diagonally aligned dipole lens 600 consistently produces accurate 45° diagonally aligned wire segments. However, in the non-45° diagonally aligned directions (e.g., vertical, horizontal), the 135° diagonally aligned dipole lens 600 produces wire segments that are not as accurate.

Figure 20:
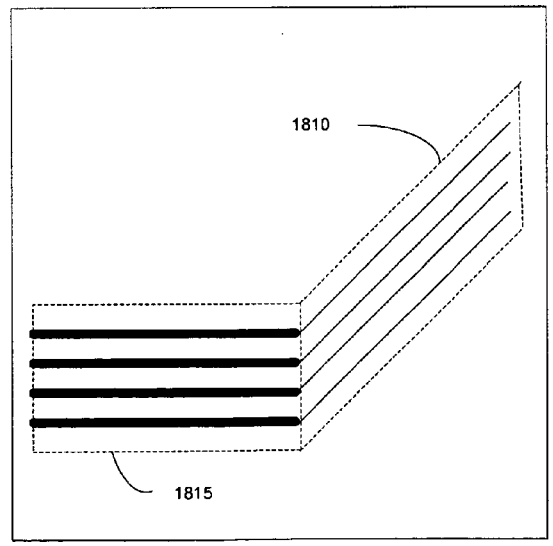
FIG. 20 illustrates a layer of an IC with 45° diagonally aligned wires that have narrow width and spacing.

FIG. 20 illustrates an example of an IC manufactured using the 135° diagonally aligned dipole lens 600. As shown in this figure, the 45° diagonal wire segments 1810 have accurate width and spacing, while the width and spacing of horizontal wire segments 1815 are not as accurate. In this figure, the 45° diagonal wire segments 1810 are accurate because the width and spacing of the 45° diagonal wire segments 1810 have low variations (e.g., width and spacing are thin). On the other hand, the horizontal wire segments 1815 are not as accurate because the width and spacing of the horizontal wire segments 1815 have high variations (e.g., width and spacing are wide).

Figure 9:
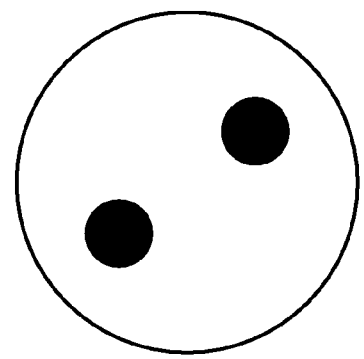
FIG. 9 illustrates a 45° dipole lens used during an illumination operation.

FIG. 9 illustrates another dipole lens 600. The dipole lens 600 has two poles 610 and 615. The two poles 610 and 615 of the dipole lens 600 are aligned in the 45°-diagonally direction. The 45° diagonally aligned dipole lens 600 consistently produces accurate 135° diagonally aligned wire segments. However, in the non-135° diagonally aligned directions (e.g., vertical, horizontal), the 45° diagonally aligned dipole lens 600 produces wire segments that are not as accurate.

Figure 21:
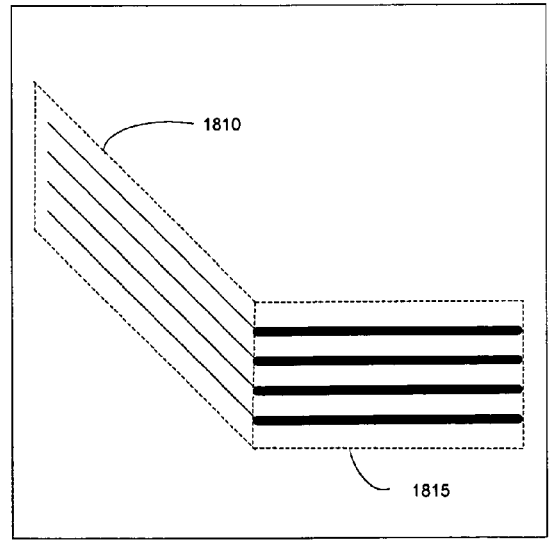
FIG. 21 illustrates a layer of an IC with 135° diagonally aligned wires that have narrow width and spacing.

FIG. 21 illustrates an example of an IC manufactured using the 45° diagonally aligned dipole lens 600. As shown in this figure, the 135° diagonal wire segments 1810 have accurate width and spacing, while the width and spacing of horizontal wire segments 1815 are not as accurate. In this figure, the 135° diagonal wire segments 1810 are accurate because the width and spacing of the 135° diagonal wire segments 1810 have low variations (e.g., width and spacing are thin). In contrast, the horizontal wire segments 1815 are not as accurate because the width and spacing of the horizontal wire segments 1815 have high variations (e.g., width and spacing are wide).

In some illumination configurations, combinations of dipole lenses are used during the illumination operation 415. In such cases, a wafer is exposed multiple times to light under different dipole lenses. A double dipole configuration is an example of such an illumination configuration. During a double dipole illumination operation, a wafer is exposed to light under two different dipole lenses, using two different masks. In some embodiments, a double dipole illumination operation may entail using vertically aligned and horizontally aligned dipole lenses, such as those illustrated in FIGS. 6 and 7. The horizontally aligned dipole lens 600 produces vertically aligned wire segments. The vertically aligned dipole lens 600 produces horizontally aligned wires segments. This double dipole configuration, which selects vertically and horizontally aligned dipole lenses, consistently produces accurate vertically and horizontally aligned wires segments. However, in the non-vertical and non-horizontal directions (e.g., diagonal), this double dipole configuration produces wire segments that are not as accurate. In other embodiments, a double dipole illumination operation may entail selecting other combinations of dipole lenses.

In the above description, dipole lenses are shown with circular poles. However, in other embodiments, dipole lenses have poles that are not circular. FIGS. 10-13 illustrates other dipole lenses with poles that have different shapes. FIG. 10 illustrates a 135° diagonally aligned dipole lens with poles that are not circular. This 135° diagonally aligned dipole lens consistently produces accurate 45° diagonally aligned wire segments while producing wire segments that are not as accurate in the non-45° diagonal directions. FIG. 11 illustrates a 45° diagonally aligned dipole lens with poles that are not circular. This 45° diagonally aligned dipole lens consistently produces accurate 135° diagonally aligned wire segments while producing wire segments that are not as accurate in the non-135° diagonal directions. FIG. 12 illustrates a horizontally aligned dipole lens with elliptical poles. This horizontally aligned dipole lens consistently produces accurate vertically aligned wire segments while producing wire segments that are not as accurate in the non-vertical directions. FIG. 13 illustrates vertically aligned dipole lenses with elliptical poles. This vertically aligned dipole lens consistently produces accurate horizontally aligned wire segments while producing wire segments that are not as accurate in the non-horizontal directions.

FIGS. 14 and 15 illustrate examples of quadrupole lenses. A quadrupole lens is another type of a stepper lens that can be used during the illumination operation 415. As shown in these figures, a quadrupole lens has four poles. The first and second poles are aligned in a direction. The third and fourth poles are aligned in a direction that is perpendicular to the alignment of the first and second poles. These quadrupole lenses, when used in the illumination operation 415, produce wire segments in numerous directions.

In particular, these quadrupole lenses consistently produce accurate wire segments along a first direction and a second direction. The first direction is perpendicular to the alignment of the first and second poles. The second direction is perpendicular to the alignment of the third and fourth poles. However, along other directions, these quadrupole lenses produce wire segments that are not as accurate. Different quadrupole lenses produce wire segments with width and/or spacing with different accuracy along different directions.

FIG. 14 illustrates a lens 1400 that is used in a quadrupole illumination. The quadrupole lens 1400 has four poles 1410-1420 that are evenly spaced about the center of the lens. The poles 1410-1420 are located at 45°, 135°, 225° and 315° positions relative to the center of the lens. This quadrupole lens consistently produces accurate vertically and horizontally aligned wire segments However, this quadrupole lens produces non-vertically and non-horizontally aligned (e.g., diagonal) wire segments that are not as accurate.

Figure 22:
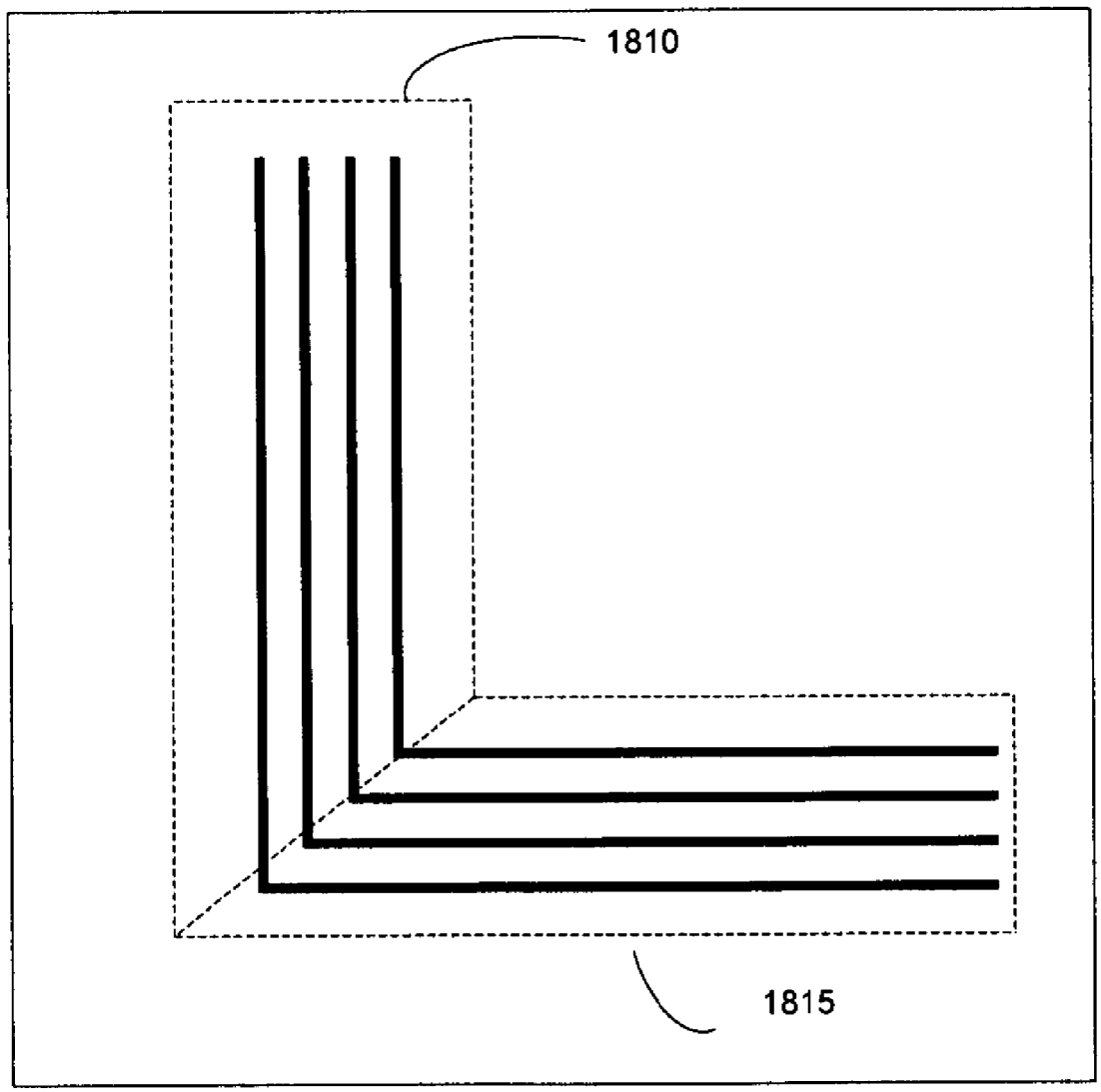
FIG. 22 illustrates a layer of an IC with vertically and horizontally aligned wires that have narrow width and spacing.

FIG. 22 illustrates an example of an IC manufactured using the vertically and horizontally aligned quadrupole lens 600. As shown in this figure, both the vertical wire segments 1810 and the horizontal wire segments 1815 have accurate width and spacing. In this instance, the vertical wire segments 1810 and horizontal wire segments 1815 are accurate because the width and spacing of both sets of wire segments have low variations (e.g., width and spacing are narrow).

FIG. 15 illustrates another quadrupole lens 1400. The quadrupole lens 1400 has four poles 1410-1420. In this illustration, the poles 1410-1420 are located at 0°, 90°, 180° and 270° positions relative to the center of the lens. This quadrupole lens consistently produces accurate 45° and 135° diagonally aligned wire segments. However, in the non-45° and non-135° diagonal (e.g., vertical, horizontal) directions, this quadrupole lens produces wire segments that are not as accurate.

In some embodiments, certain quadrupole lenses can produce accurate vertically, horizontally and diagonally aligned wire segments. Such quadrupole lenses have poles that are non-circular. For instance, the poles 1410-1420 of the quadrupole lens 1400 in FIGS. 14 and 15 can be replaced with non-circular poles to create a quadrupole lens that produces accurate vertically, horizontally and diagonally aligned wire segments (i.e., width and/or spacing that are close to a minimum width and/or minimum spacing on a consistent basis).

In some instances, both the quadrupole and double dipole configurations produce accurate wire segments. However, along two particular directions (e.g., vertical and horizontal), the double dipole configuration produces wire segments that are comparatively more accurate than the quadrupole configuration. As such, in some cases, the double dipole configuration produces wire segments that are consistently narrower than wire segments produced by the quadrupole configuration.

FIG. 16 illustrates a lens 1400. The lens 1400 has eight poles 1410-1440 that are evenly spaced about the center of the lens. In this instance, the octagonal lens 1400 consistently produces accurate wire segments along multiple directions. However, the produced width and spacing of the wire segments are not as accurate as those produced by a dipole or quadrupole lens.

FIG. 17 illustrates a lens 1700. The lens 1700 has an annular aperture 1710. In this instance, the annular lens 1700 consistently produces accurate wire segments along all directions. However, the produced width and spacing of the wire segments are not as accurate as those produced by a dipole or quadrupole lens.

FIGS. 18-22 illustrate various layers of an IC manufactured using different stepper lenses. For each layer of an IC depicted, numerous narrow and wide wire segments are shown. In their respective descriptions, the accurately produced wires are the narrower wire segments while the non-accurately produced wires are the wider wire segments. However, one of ordinary skill will realize that the accurately produced wires can be the wider wires, while the non-accurately produced wires can be the narrower wires.

E. Illumination Configuration without a Stepper Lens

In the illumination configuration and operation mentioned above, various stepper lenses have been described. These stepper lenses may be used in numerous embodiments. However, in other embodiments, a stepper lens is not included in an illumination configuration that performs an illumination operation 415 during the lithography process 400.

Figure 23:
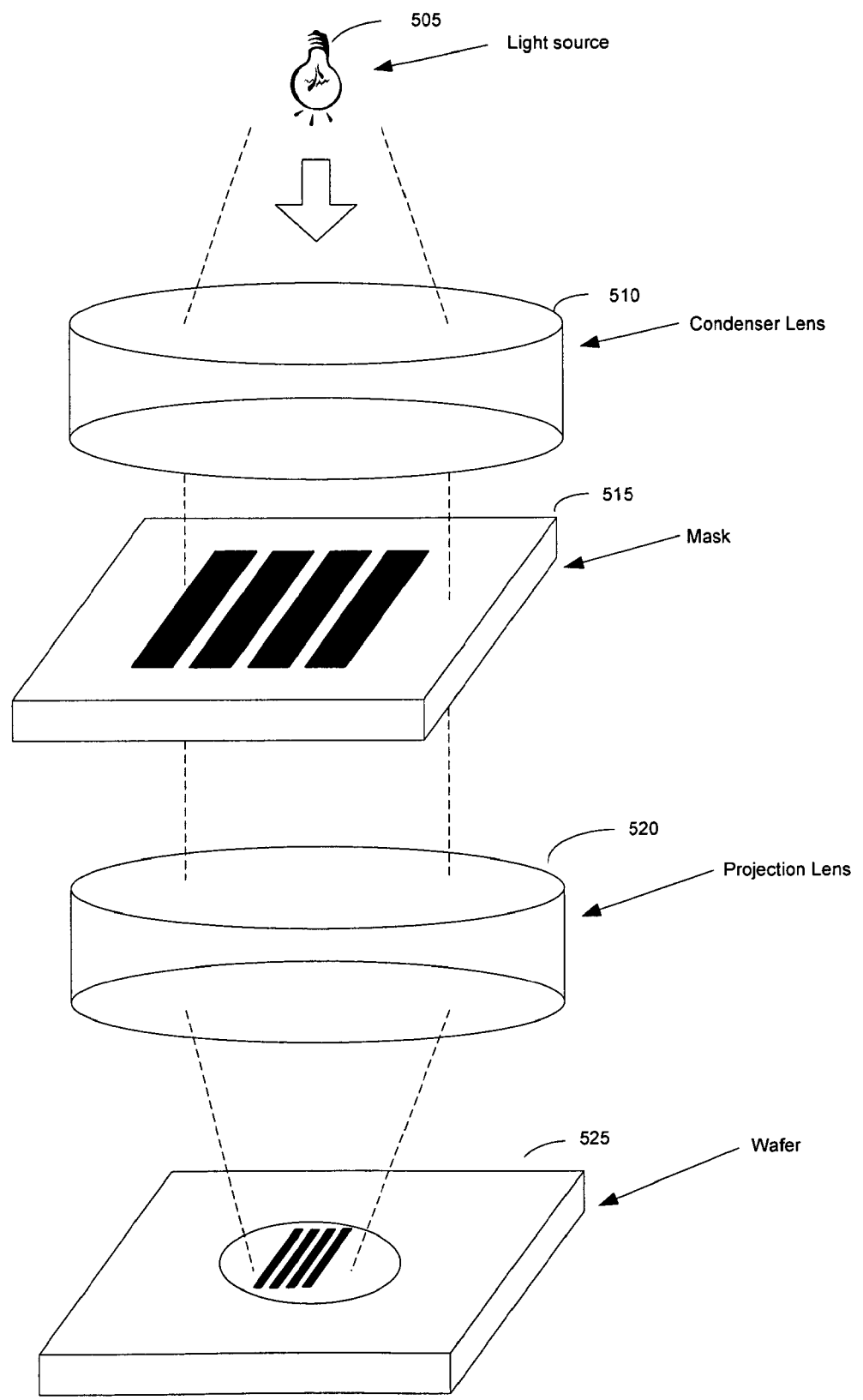
FIG. 23 illustrates the process of on-axis illumination of a mask onto a wafer.

FIG. 23 illustrates an example of such a configuration that does not include a stepper lens. In this illumination configuration, the light source 505 is not shifted away from a normal incidence. As such, the light coming from the light source 505 light shines at near normal incidence. When the light coming from the illuminator shines at near normal incidence, the light strikes the surface of a lens at a perpendicular angle. In this instance, the lens is the condenser lens 510. When the light shines at near normal incidence and no stepper lens is included in this illumination configuration, the illumination operation 415 is typically referred to as on-axis illumination.

II. Design Aware Manufacturing and Manufacturing Aware Design

A. Overview

Figure 24:
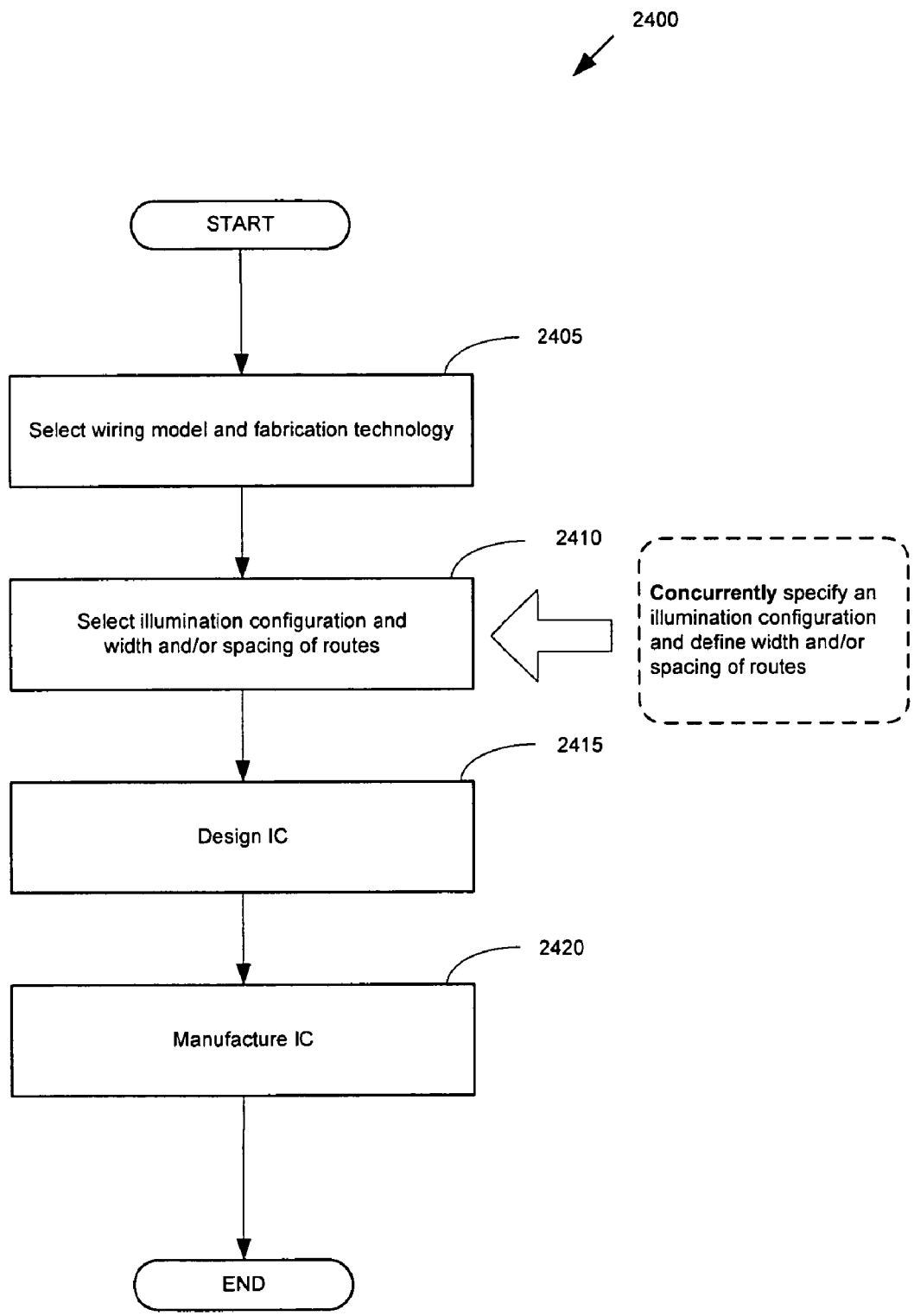
FIG. 24 illustrates a process for designing and manufacturing an IC.

Some embodiments provide a process for designing and manufacturing an IC. FIG. 24 conceptually illustrates an example of one such process 2400. As shown in this figure, a wiring model is first identified (at 2405) during the process 2400. In some embodiments, identifying the wiring model entails identifying the number of wiring layers and the preferred direction of each of the wiring layer. Furthermore, a fabrication technology is also identified (at 2405) during the process 2400. In some embodiments, identifying the fabrication technology entails identifying the fabrication process (e.g., 180 nm, 130 nm, 90 nm, 65 nm) that will be used to manufacture the IC.

After identifying (at 2405) the wiring model and the fabrication technology, the illumination configuration and the dimensional attributes of the routes for the IC layout are selected (at 2410) during the process 2400. In some embodiments, selecting the illumination configuration entails specifying at least one stepper lens that will be used to illuminate at least one mask onto at least one particular layer of the IC layout. In some embodiments, this selection entails specifying a stepper lens for each particular layer of the IC layout. Additionally, in some embodiments, selecting the dimensional attributes of the routes includes defining the minimum width and/or minimum spacing for routes along different directions on at least one particular layer of the IC layout. Furthermore, in some embodiments, this selection entails selecting the minimum width and/or minimum spacing of routes along different directions on each particular layer of the IC layout. In some of these embodiments, the selected minimum width and/or minimum spacing along different directions on each particular layer can be different.

After defining the minimum width and/or minimum spacing for routes along different directions on at least one particular layer of the IC layout (i.e. selecting the dimensional attributes of the routes), some embodiments store the defined minimum width and/or minimum spacing of the routes as design rules in one or more data structures or data storages (e.g., design files). One example of such a storage is a Library Exchange Format/Design Exchange Format ("LEF/DEF") design file that stores the dimensional attributes (e.g., width, spacing) of the routes for use by an EDA tool, such as a placer and a router. Another example is a rule deck file that can be used by a design rule checker ("DRC") to perform a design rule checking operation. Another example of storage is a rule deck file (e.g., Layout Versus Schematic ("LVS") file, parasitic extraction ("RCX") file) that can be used during an extraction operation. The use of such design files will be further described below by reference to FIG. 40.

Figure 25:
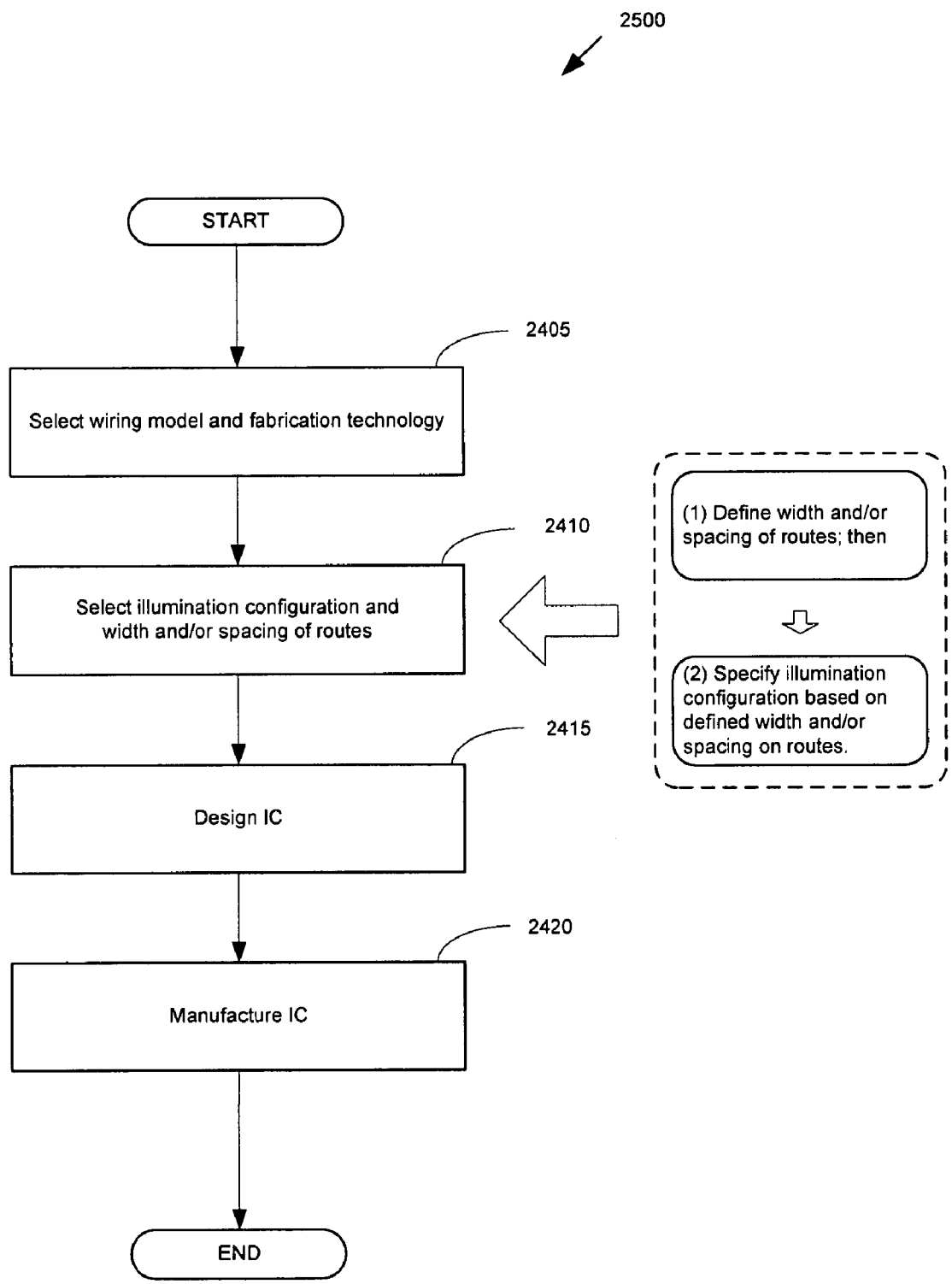
FIG. 25 illustrates a process for designing and manufacturing an IC, where the manufacturing operation is aware of the design operation.
Figure 26:
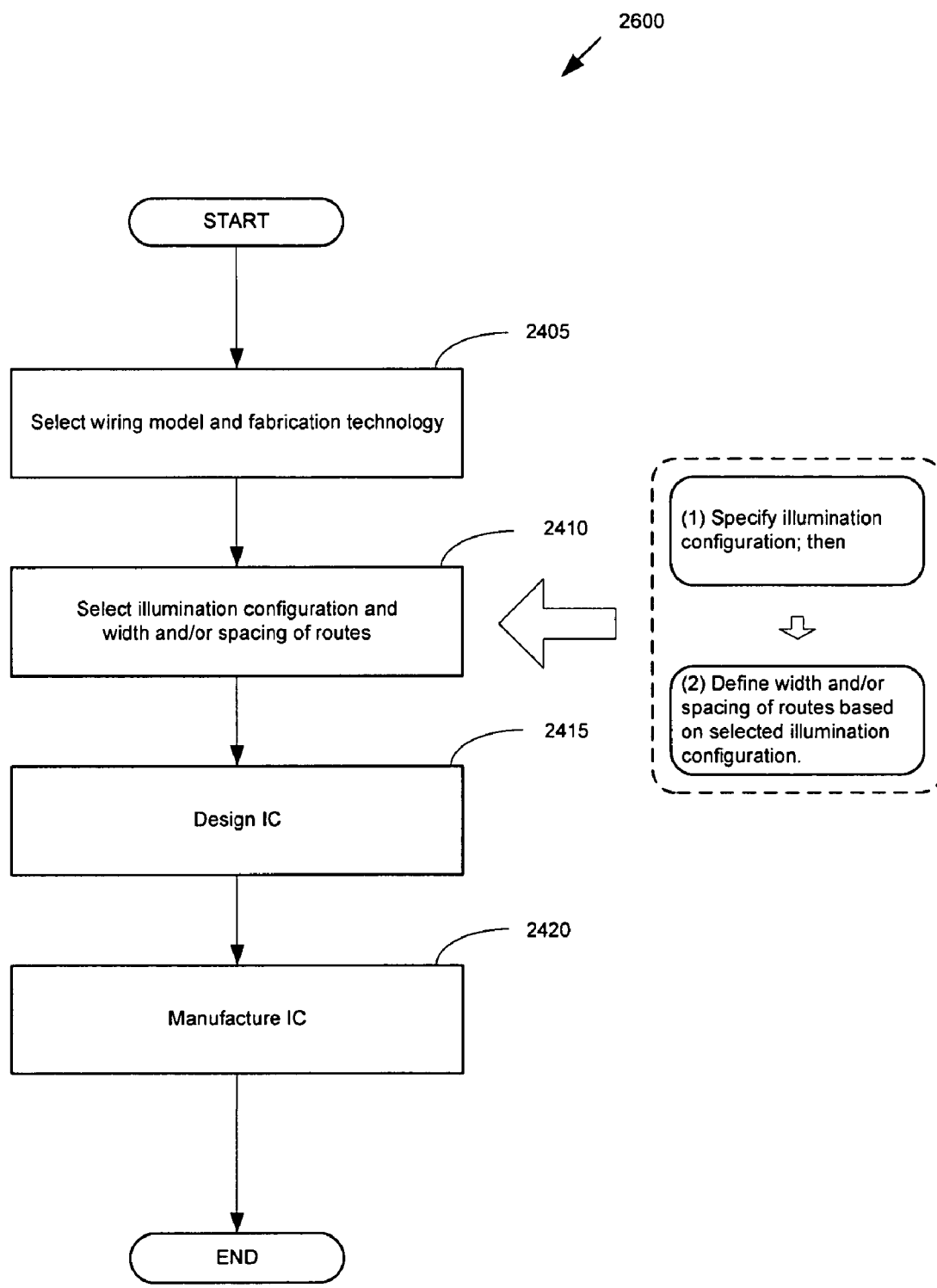
FIG. 26 illustrates a process for designing and manufacturing an IC, where the design operation is aware of the manufacturing operation.

In some embodiments, the selection operation (at 2410) entails concurrently specifying the dimensional attributes of the routes (e.g., minimum width and/or minimum spacing of the routes for the IC layout) and the illumination configuration, as shown in FIG. 24. Alternatively, as illustrated in FIG. 25, this selection operation (at 2410) entails first defining the dimensional attributes of the routes, then identifying an illumination configuration based on the dimensional attributes of the routes. In yet other embodiments, the selection operation (at 2410) entails first selecting an illumination configuration that will be used to manufacture an IC, then defining the minimum width and/or minimum spacing of the routes for the IC layout based on the selected illumination configuration, as illustrated in FIG. 26. These selection operations that are performed at 2410 will be further described below.

Once the minimum width and/or minimum spacing of routes for the IC layout and the illumination configuration that will be used during the manufacturing of the IC are selected (at 2410), the next operation of the process 2400 is a design operation 2415. The design operation 2415 entails designing the layout of the IC based on the minimum width and/or minimum spacing of the routes that were specified at 2410. As mentioned above, some embodiments might perform the design operation 2415 based on at least one design file (e.g., LEF/DEF file, rule deck file), which contains the dimensional attributes that indicate the specified minimum width and/or minimum spacing of the routes for at least one layer of the IC layout. This design operation 2415 will be further described below by reference to FIG. 40.

A manufacturing operation 2420 follows the design operation 2415. The manufacturing operation 2420 entails manufacturing the IC based on the IC layout that was designed during the design operation 2415. The manufacturing operation 2420 uses the illumination configuration that was specified at 2410 to manufacture the IC. This manufacturing operation 2420 will be further described below by reference to FIG. 41.

B. Defining Width of Routes and Selecting an Illumination Configuration i. Design Aware Manufacturing As mentioned above by reference to FIG. 25, some embodiments first define the minimum width and/or minimum spacing of the routes for each particular layer of an IC layout. Based on the defined minimum width and/or minimum spacing, these embodiments identify an illumination configuration for each particular layer. In some embodiments, identifying an illumination configuration entails selecting at least one stepper lens. Specifically, in some embodiments, when narrow minimum routes (i.e., routes with narrow minimum width and/or minimum spacing) are defined along a direction, a stepper lens is selected that consistently produces wire segments in that particular direction with width and spacing that are close to the desired width and spacing (i.e., accurate wires). This process is referred to as a design aware manufacturing process because the illumination configuration is based on the defined minimum width and/or minimum spacing of the routes.

Figure 27:
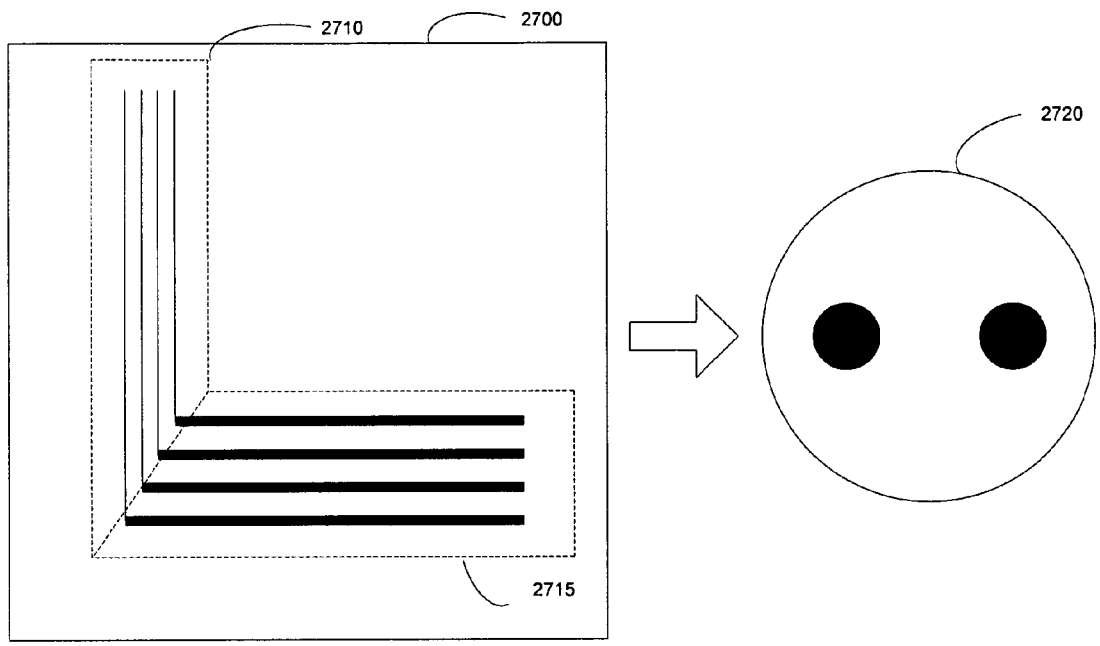
FIG. 27 illustrates selecting a horizontally aligned dipole lens based on defining narrow vertically aligned routes.

FIG. 27 illustrates a portion of a layer 2700 of an IC layout. As shown in this figure, the layer 2700 includes vertically aligned route segments 2710 and horizontally aligned route segments 2715. The vertically aligned route segments 2710 have width and spacing that are narrower than the width and spacing of the horizontally aligned route segments 2715. Accordingly, after defining the minimum width and/or minimum spacing of the route segments 2710 and 2715 on layer 2700, some embodiments select a horizontally aligned dipole lens 2720, as shown in FIG. 27. Some embodiments select the horizontally aligned dipole lens 2720 because, as previously mentioned, such a dipole lens consistently produces accurate vertical wires.

Figure 28:
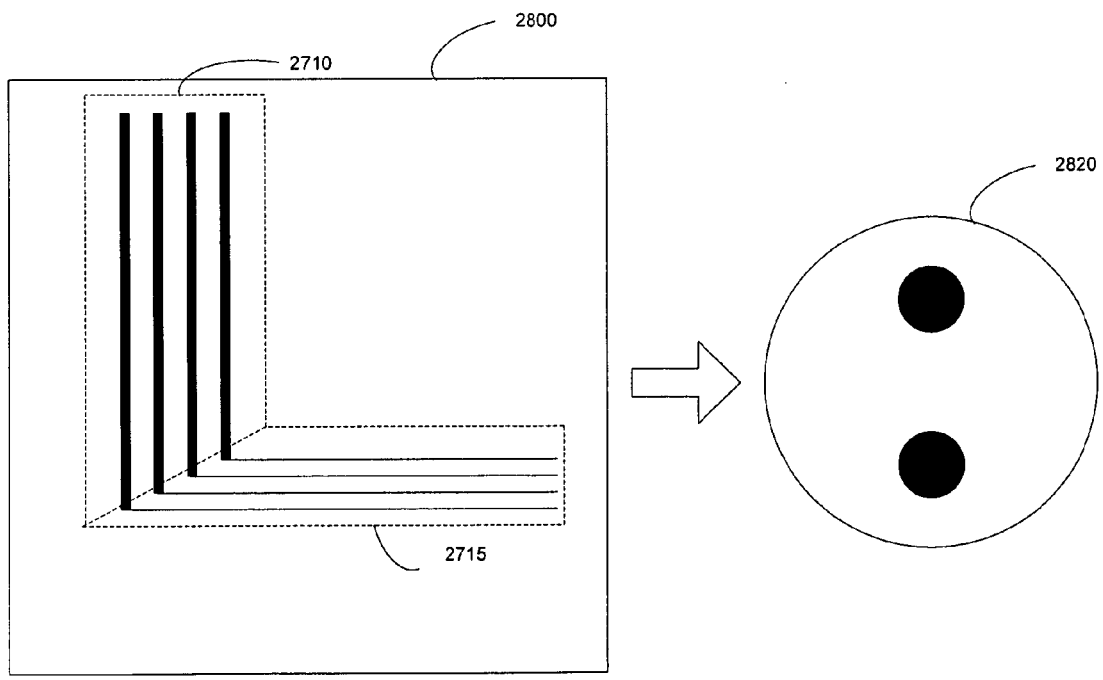
FIG. 28 illustrates selecting a vertically aligned dipole lens based on defining narrow horizontally aligned routes.

FIG. 28 illustrates a portion of a layer 2800 of an IC layout. As shown in this figure, the layer 2700 includes vertically aligned route segments 2710 and horizontally aligned route segments 2715. The vertically aligned route segments 2710 have width and spacing that are wider than the width and spacing of the horizontally aligned route segments 2715. Accordingly, after defining the minimum width and/or minimum spacing of the route segments 2710 and 2715 on layer 2800, some embodiments select a vertically aligned dipole lens 2820, as shown in FIG. 28. Some embodiments select the vertically aligned dipole lens 2820 because, as previously mentioned, such a dipole lens consistently produces accurate horizontal wires.

Figure 29:
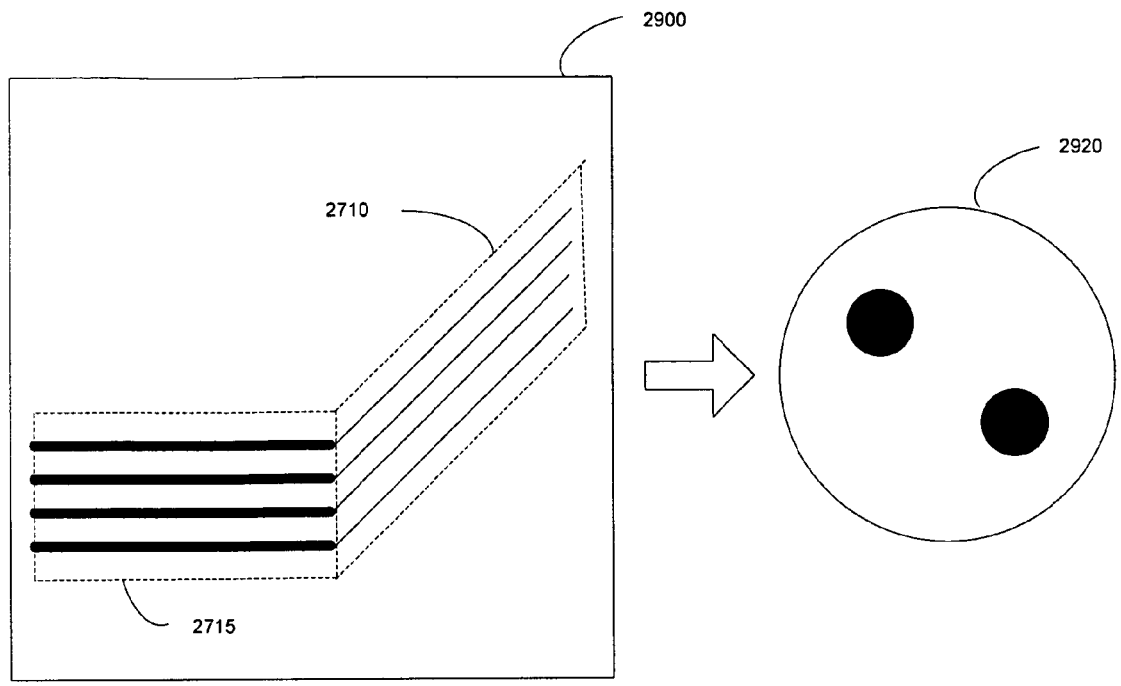
FIG. 29 illustrates selecting a 135° diagonally aligned dipole lens based on defining narrow 45° diagonally aligned routes.

FIG. 29 illustrates a portion of a layer 2900 of an IC layout. As shown in this figure, the layer 2700 includes 45° diagonally aligned route segments 2710 and horizontally aligned route segments 2715. The 45° diagonally aligned route segments 2710 have width and spacing that are narrower than the width and spacing of the horizontally aligned route segments 2715. Accordingly, after defining the minimum width and/or minimum spacing of the route segments 2710 and 2715 on layer 2900, some embodiments select a 135° diagonally aligned dipole lens 2920, as shown in FIG. 29. Some embodiments select the 135° diagonally aligned dipole lens 2920 because, as previously described, such a dipole lens consistently produces accurate 45° diagonally aligned wires.

Figure 30:
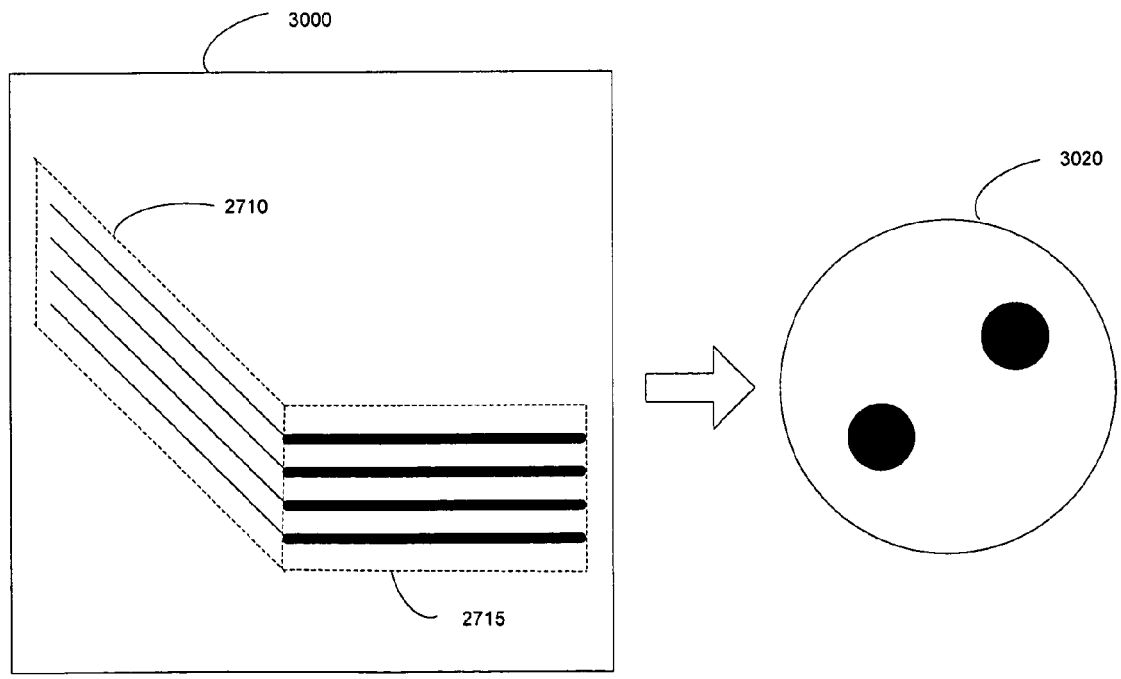
FIG. 30 illustrates selecting a 45° diagonally aligned dipole lens based on defining narrow 135° diagonally aligned routes.

FIG. 30 illustrates a portion of a layer 3000 of an IC layout. As shown in this figure, the layer 2700 includes horizontally aligned route segments 2715 and 135° diagonally aligned route segments 2710. The 135° diagonally aligned route segments 2710 have width and spacing that are wider than the width and spacing of the horizontally aligned route segments 2715. Accordingly, after defining the minimum width and/or minimum spacing of the route segments 2710 and on layer 3000, some embodiments select a 45° diagonally aligned dipole lens 3020, as shown in FIG. 30. Some embodiments select the 45° diagonally aligned dipole lens 3020 because, as previously mentioned, such a dipole lens consistently produces accurate 135° diagonally aligned wires.

Figure 31:
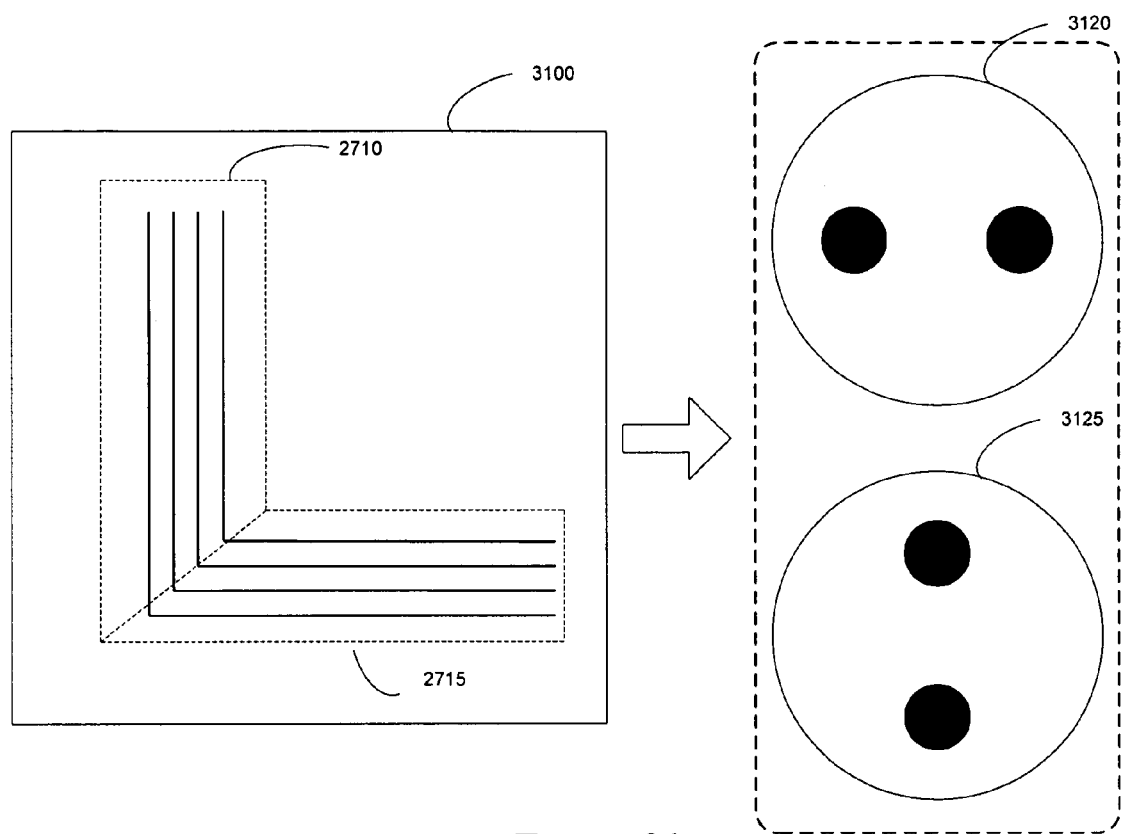
FIG. 31 illustrates selecting vertically and horizontally aligned dipole lenses (i.e. double dipole) based on defining narrow vertically and horizontally aligned routes.

FIG. 31 illustrates a portion of a layer 3100 of an IC layout. The layer 3100 includes vertically aligned route segments 2710 and horizontally aligned route segments 2715. Both vertically aligned route segments 2710 and horizontally aligned route segments 2715 have width and spacing that are narrow. Accordingly, after defining the minimum width and/or minimum spacing of the route segments 2710 and 2715 on layer 3100, some embodiments select a horizontally aligned dipole lens 3120 and a vertically aligned dipole lens 3125 (i.e. double dipole), as shown in FIG. 31. Some embodiments select the vertically aligned dipole lens 3120 and the horizontally aligned dipole lens 3125 because, as previously described, such dipole lenses consistently produce accurate vertical and horizontal wires.

Figure 32:
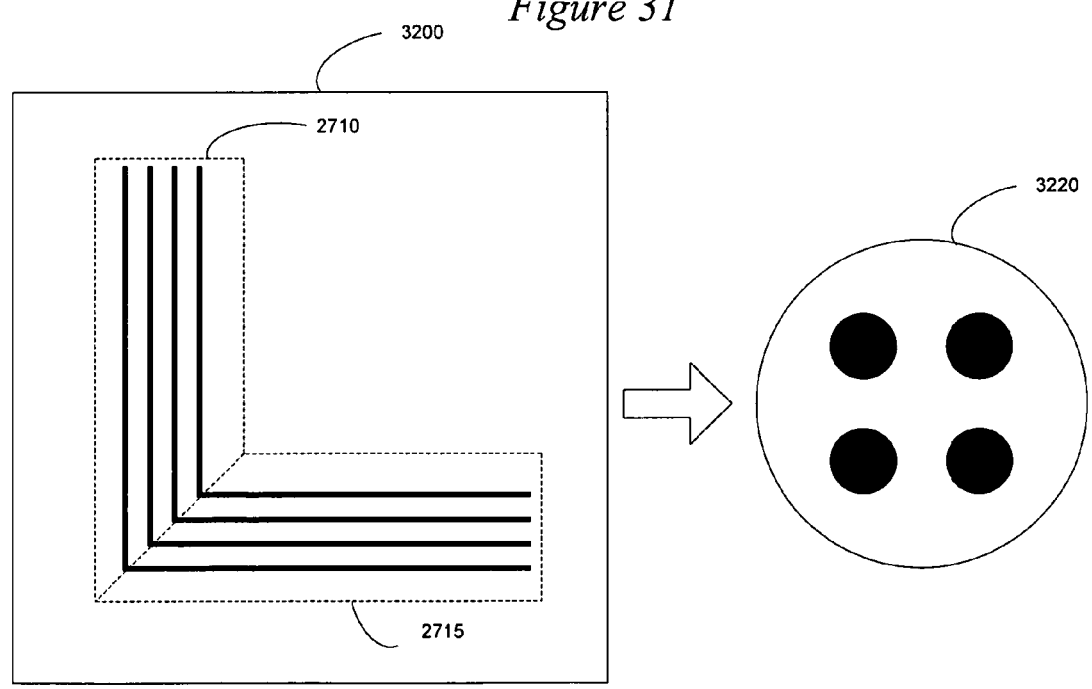
FIG. 32 illustrates selecting quadrupole lens based on defining narrow vertically and horizontally aligned routes.

FIG. 32 illustrates a portion of a layer 3200 of an IC layout. The layer 3200 includes vertically aligned route segments 2710 and horizontally aligned route segments 2715. Both the vertically aligned route segments 2710 and horizontally aligned route segments 2715 have width and spacing that have low variations (e.g., narrow width and spacing) (although not as low as the variation in the width and spacing of route segments 2710 and 2715 in FIG. 31). Accordingly, after defining the minimum width and/or minimum spacing of the route segments 2710 and 2715 on layer 3200, some embodiments select a quadrupole lens 3220, as shown in FIG. 32. Some embodiments select the quadrupole lens 3220 because, as previously mentioned, such a quadrupole lens consistently produces accurate vertical and horizontal wires.

ii. Manufacturing Aware Design

As previously mentioned by reference to FIG. 26, some embodiments first select an illumination configuration before defining the minimum width and/or minimum spacing of the routes for a particular layer. In some embodiments, selecting the illumination configuration entails specifying at least one stepper lens for at least one layer of the IC layout. In other embodiments, selecting the illumination configuration entails specifying a stepper lens for each layer of the IC layout. As such, some embodiments first specify a stepper lens then define the minimum width and/or minimum spacing of the routes for a particular layer of the IC layout based on the specified stepper lens.

Specifically, when a stepper lens that consistently produces accurate wires along a particular direction of a layer is specified, the minimum width and/or minimum spacing of routes along that particular direction of the layer are narrowly defined. In other embodiments, when a stepper lens that consistently produces accurate wires along a preferred direction of a layer is specified, the minimum width and/or minimum spacing of routes along the preferred direction of the layer are narrowly defined. This process is referred to as a manufacturing aware design process because the defined minimum width and/or minimum spacing of the routes for a particular layer are based on the specified illumination configuration (i.e., specified stepper lens) for that particular layer.

As described in Section I, some embodiments use a production line manufacturing process that includes more than one machine to create numerous ICs. Each machine in the production line manufacturing process creates a particular layer for each IC that is manufactured by the production line. Each machine in the production line has a stepper lens (i.e., illumination configuration that is specific to the particular layer for which it is used).

Consequently, when a production line manufacturing process is used, some embodiments define the minimum width and/or minimum spacing of routes for a particular layer based on the stepper lens that is used on the machine that will manufacture that particular layer. For example, if the first machine of the production line includes a vertical dipole lens, that particular layer of all the ICs that are manufactured by the first machine will have defined minimum width and/or minimum spacing that are narrow in the horizontal direction.

Figure 33:
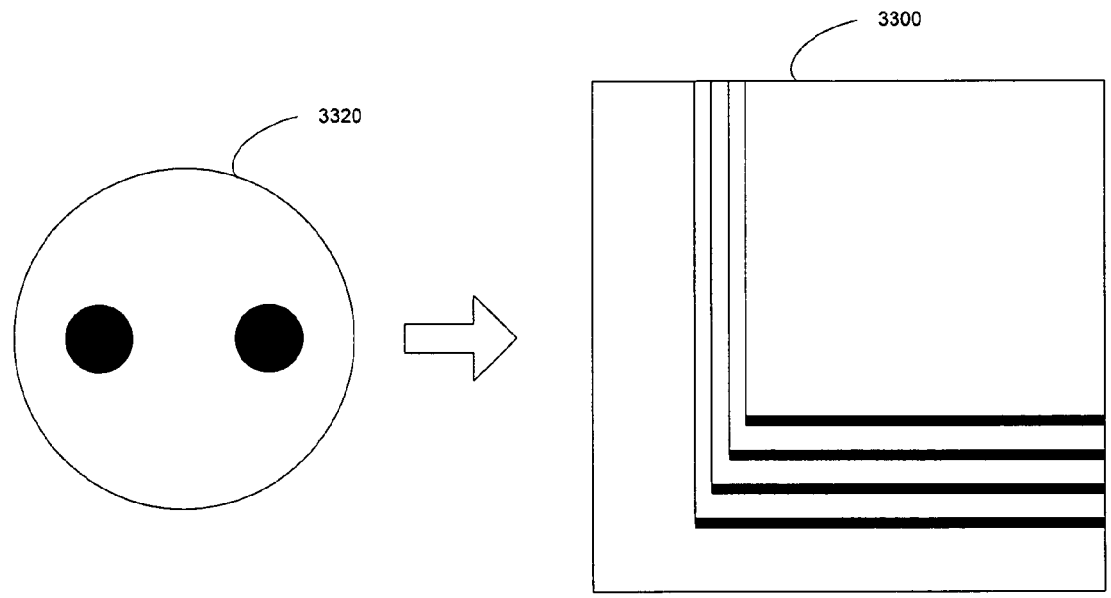
FIG. 33 illustrates a portion of a layer of an IC layout designed under a specified horizontally aligned dipole lens.

FIG. 33 illustrates a portion of a layer 3300 of the IC layout designed with a specified horizontally aligned dipole lens. As shown in this figure, some embodiments define narrow minimum width and/or minimum spacing for the vertically aligned route segments 3810 and wide minimum width and/or minimum spacing for the horizontally aligned route segments 3815 after a horizontally aligned dipole lens 3320 is specified. Some embodiments define narrow minimum width and/or minimum spacing for the vertically aligned route segments 3810 and wide minimum width and/or minimum spacing for the horizontally aligned route segments 3815 because, as previously mentioned, a horizontally aligned dipole lens consistently produces vertically aligned wire segments that are accurate (i.e., width and spacing that are close to the desired width and spacing on a constant basis) while producing non-vertically aligned wire segments that are not as accurate (i.e., width and spacing of wire segments are not as close to the desired width and spacing on a constant basis).

Figure 34:
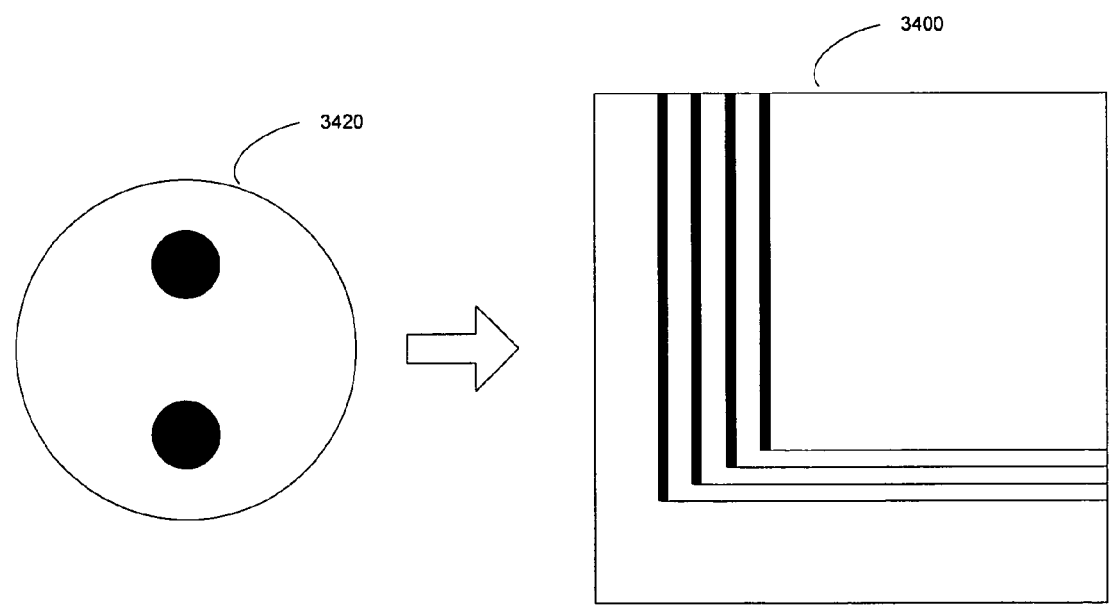
FIG. 34 illustrates a portion of a layer of an IC layout designed under a specified vertically aligned dipole lens.

FIG. 34 illustrates a portion of a layer 3400 of the IC layout designed under a specified vertically aligned dipole lens. As shown in this figure, some embodiments define narrow minimum width and/or minimum spacing for the horizontally aligned route segments 3815 and wide minimum width and/or minimum spacing for the vertically aligned route segments 3810 after a vertically aligned dipole lens 3420 is specified. Some embodiments define narrow minimum width and/or minimum spacing for the horizontally aligned route segments 3815 and wide minimum width and/or minimum spacing for the vertically aligned route segments 3810 because, as previously described, a vertically aligned dipole lens consistently produces horizontally aligned wires segments that are accurate while producing non-horizontally aligned wire segments that are not as accurate.

Figure 35:
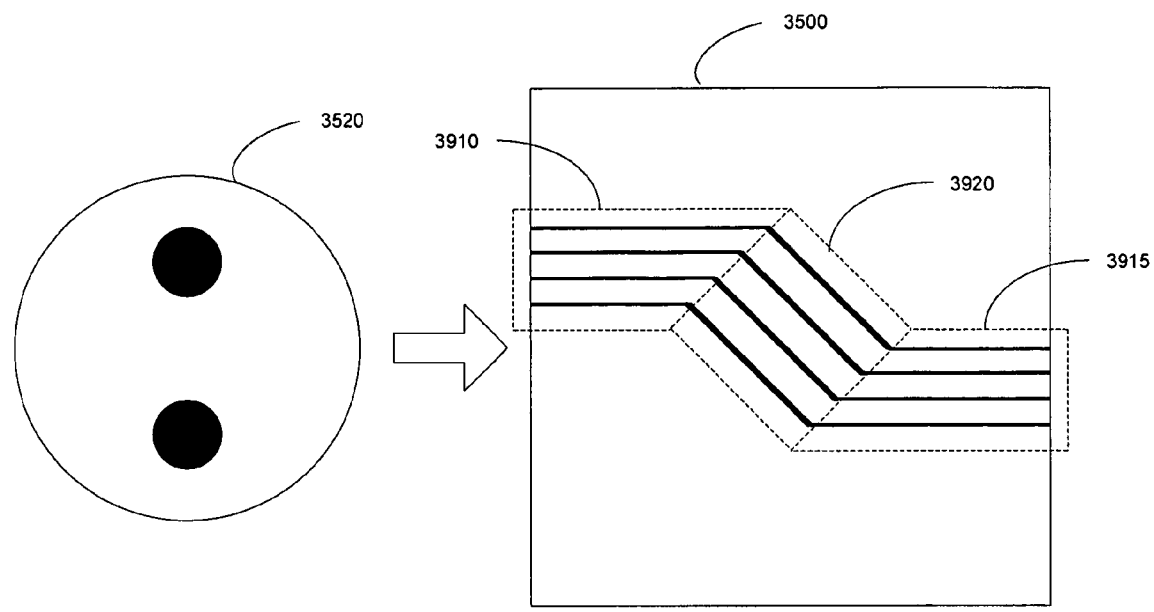
FIG. 35 illustrates a portion of a layer of another IC layout designed under a specified vertically aligned dipole lens.

FIG. 35 illustrates a portion of a layer 3500 of the IC layout designed under a specified vertically aligned dipole lens. As shown in this figure, some embodiments define narrow minimum width and/or minimum spacing for the horizontally aligned route segments 3810-3815 and wide minimum width and/or minimum spacing for the diagonally aligned route segments 3820 after a vertically aligned dipole lens 3520 is specified.

Figure 36:
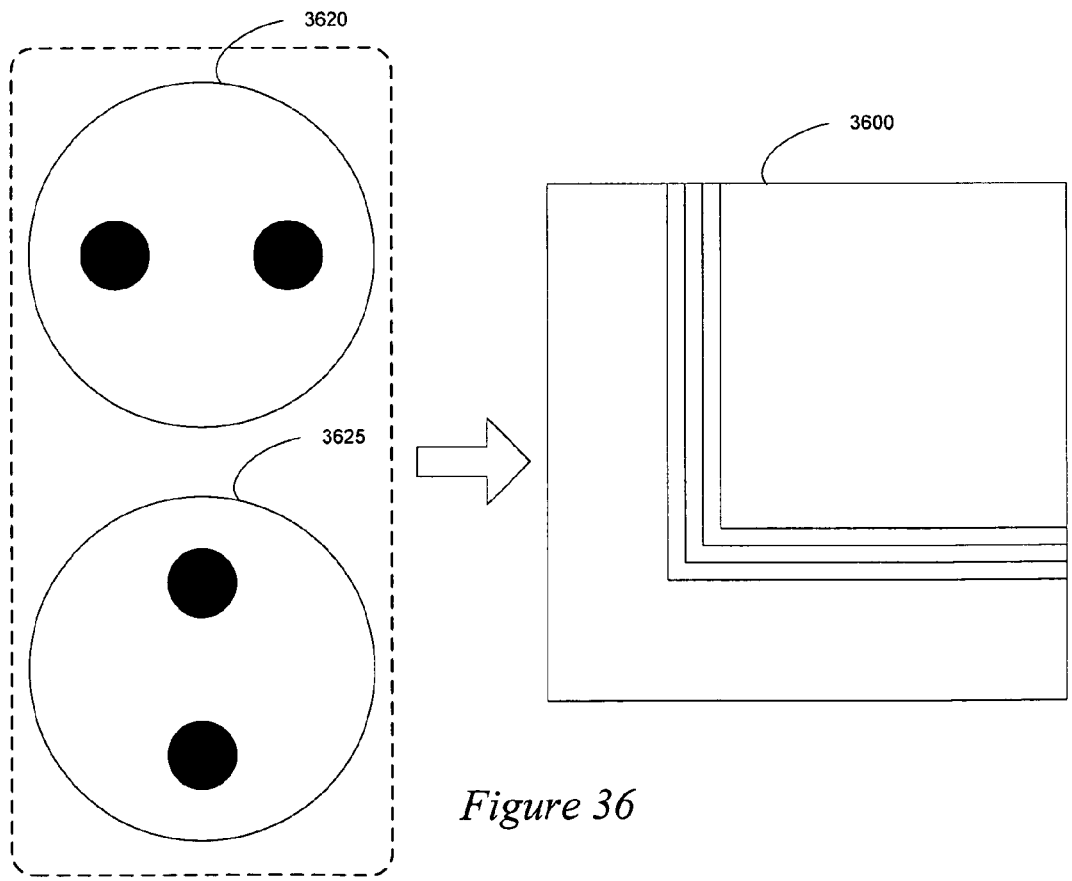
FIG. 36 illustrates a layer of an IC layout designed under a specified double dipole illumination configuration.

FIG. 36 illustrates a portion of a layer 3600 of the IC layout designed under a specified double dipole illumination configuration. As shown in this figure, some embodiments define narrow minimum width and/or minimum spacing for the vertically aligned route segments 3810 and the horizontally aligned route segments 3815 after horizontally aligned dipole lens 3620 and vertically aligned dipole lens 3625 are specified. Some embodiments define narrow minimum width and/or minimum spacing for both the vertically aligned route segments 3810 and the horizontally aligned route segments 3815 because, as previously mentioned, a combination of a horizontally aligned dipole lens and a vertically aligned dipole lens consistently produces accurate vertically and horizontally aligned wire segments.

Figure 37:
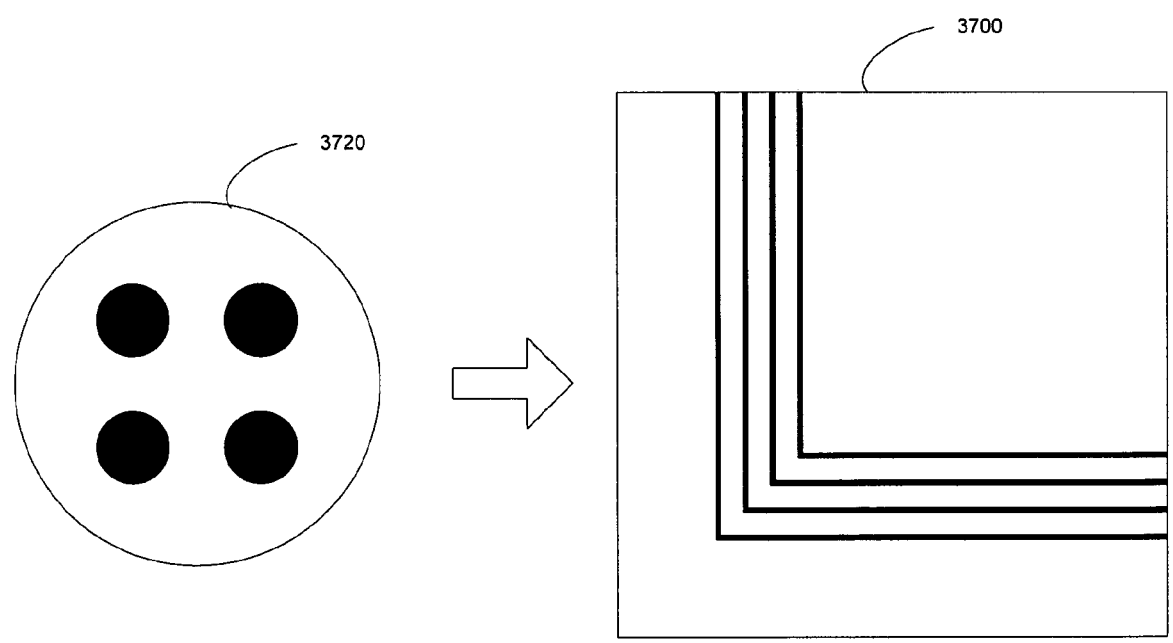
FIG. 37 illustrates a layer of an IC layout designed under a specified quadrupole lens.

FIG. 37 illustrates a portion of a layer of the IC layout designed under a specified quadrupole lens. As shown in this figure, some embodiments define narrow minimum width and/or minimum spacing for the vertically aligned route segments 3810 and the horizontally aligned route segments 3815 after a quadrupole lens 3720 is specified. Some embodiments define narrow minimum width and/or minimum spacing for the vertically aligned route segments 3810 and the horizontally aligned route segments 3815 because, as previously described, a quadrupole lens consistently produces accurate vertically and horizontally aligned wire segments (such as the one shown in FIG. 36).

However, a quadrupole lens produces vertically and horizontally aligned wires segments that are not as accurate as those produced by a combination of a horizontally aligned dipole lens and a vertically aligned dipole lens (i.e., double dipole). As such, if a quadrupole lens is specified, some embodiments define minimum width and/or minimum spacing for the vertically aligned route segments 3810 and the horizontally aligned route segments 3815 that are not as narrow as those defined in an embodiment where a combination of a horizontally and vertically aligned dipole lenses is specified.

Furthermore, some embodiments define narrow minimum width and/or minimum spacing for vertically, horizontally, and diagonally aligned routes when a quadrupole lens with non-circular poles is specified.

Figure 38:
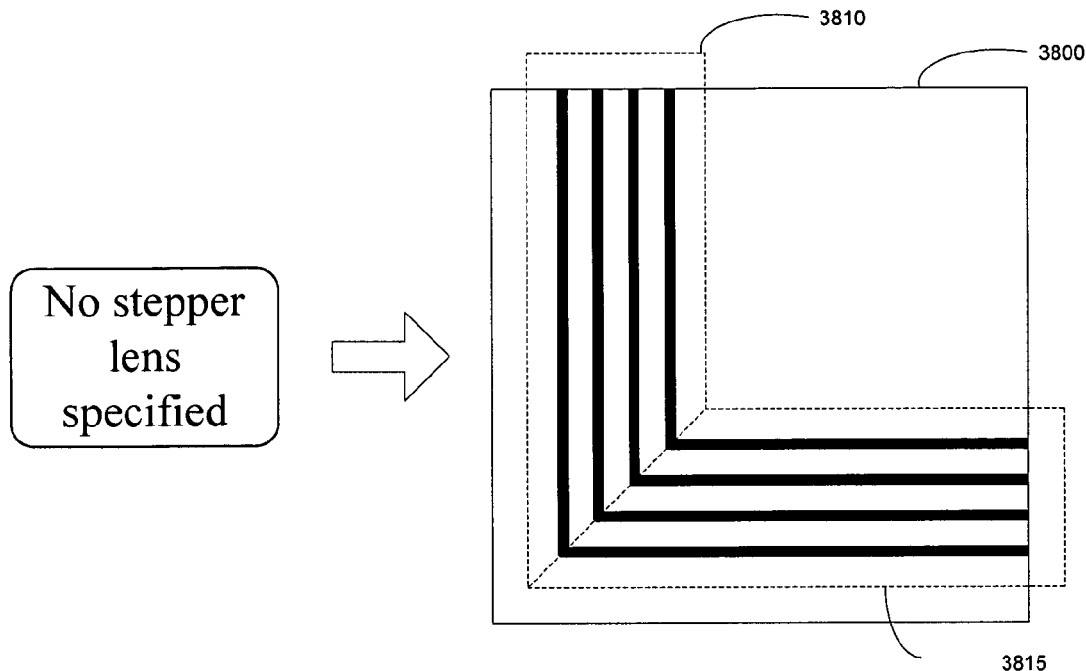
FIG. 38 illustrates a portion of a layer of an IC layout designed without any specified illumination configuration.

FIG. 38 illustrates a portion of a layer 3800 of the IC layout designed without any specified illumination configuration. As shown in this figure, some embodiments define wide minimum width and/or minimum spacing for the vertically aligned route segments 3810 and the horizontally aligned route segments 3815 when no illumination configuration is specified.

Figure 39:
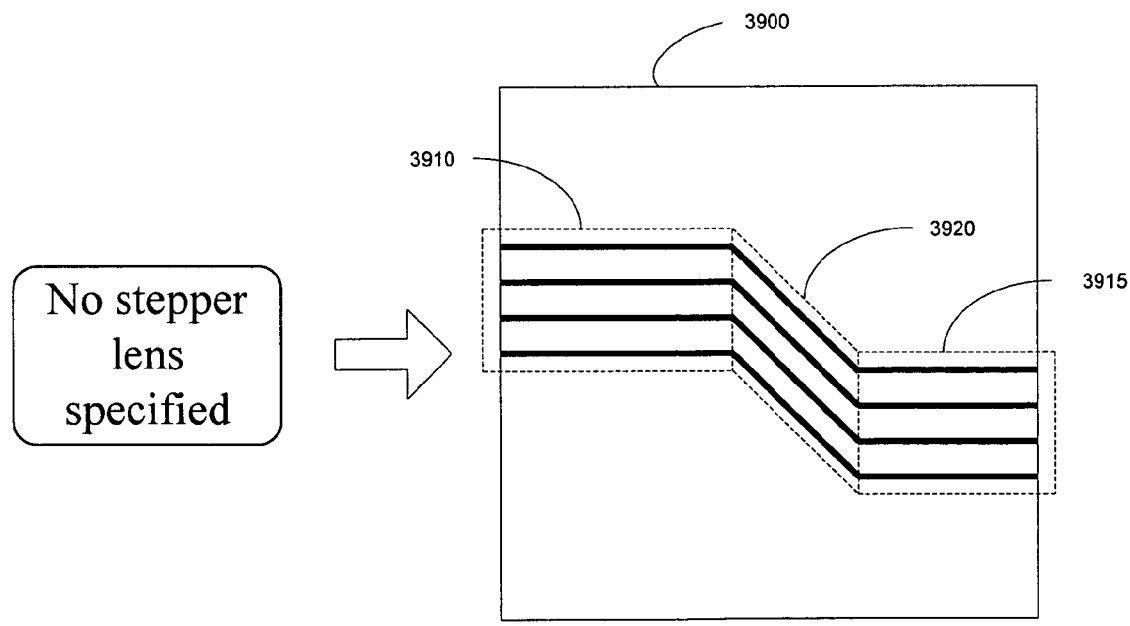
FIG. 39 illustrates a portion of a layer of another IC layout designed without any specified illumination configuration.

FIG. 39 illustrates a portion of a layer 3900 of the IC layout designed without any specified illumination configuration. As shown in this figure, some embodiments define wide minimum width and/or minimum spacing for the horizontally aligned routes segments 3910-3915 and the diagonally aligned route segments 3920 when no illumination configuration is specified.

iii. Concurrent Selection of Illumination Configuration and Definition of Width of Routes As shown in FIG. 24, in some embodiments, the selection (at 2410) entails the concurrent selection of the illumination configuration and the defining of the minimum width and/or minimum spacing of the routes. This concurrent selection includes specifying an optimal combination of the stepper lens and the route attributes (e.g., minimum width, minimum spacing) for at least one layer of the IC layout. In other embodiments, the concurrent selection includes specifying an optimal combination of the stepper lens and the route attributes for each layer of the IC layout.

For instance, some embodiments specify a vertically aligned dipole lens while concurrently defining narrow minimum routes along the horizontal direction and wide minimum routes along the non-horizontal directions. Other embodiments specify a horizontally aligned dipole lens while concurrently defining narrow minimum routes along the vertical direction and wide minimum routes along the non-vertical directions.

Additionally, some embodiments specify a vertically and horizontally aligned quadrupole lens while concurrently defining narrow minimum routes along the vertical and horizontal directions and wide minimum routes along the non-vertical and non-horizontal directions (e.g., diagonal directions). Alternatively, other embodiments specify vertically and horizontally aligned dipole lenses (i.e., specifying a double dipole configuration) while concurrently defining narrow minimum routes along the vertical and horizontal directions and wide minimum routes along the non-vertical and non-horizontal directions.

Moreover, other embodiments specify a diagonal aligned quadrupole lens while concurrently defining narrow minimum routes along the 45° and 135° diagonal directions and wide minimum routes along the non-45° and non-135° diagonal directions (e.g., vertical, horizontal). Other embodiments might specify other stepper lens while concurrently defining other variations of minimum width and/or minimum spacing of routes.

Furthermore, some embodiments might perform several iterations of the selection (at 2410) before an optimal combination of the stepper lens and the width and/or spacing of routes is specified.

C. Designing Integrated Circuits

Figure 40:
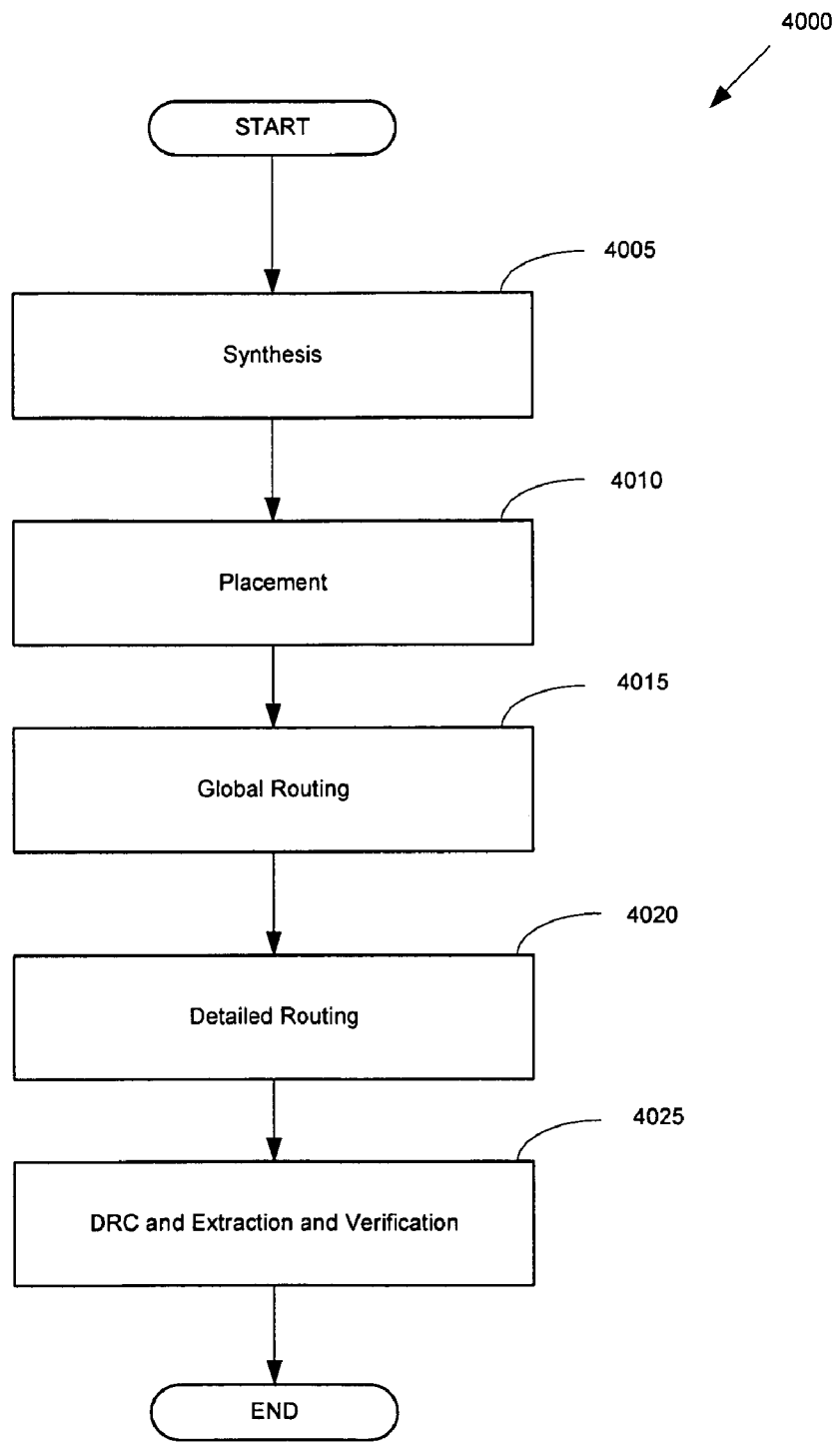
FIG. 40 illustrates a process of designing an IC.

FIG. 40 illustrates a process 4000 for designing an IC. As shown in this figure, the initial operation of the process 4000 is a synthesis operation 4005. This operation develops a circuit representation of the IC based on a logical representation of the IC. The logical representation provides a behavioral description of the IC (i.e. description of the functions(s) of the IC), while the circuit representation provides a circuit description of the IC. The circuit description is typically provided in terms of circuit elements, such as cells, macros, gates, transistors and interconnection between these elements.

As further shown in FIG. 40, the operation after the synthesis operation in the process 4000 is a placement operation 4010. This placement operation converts the circuit representation of the IC into a geometric representation. The geometric representation is called a layout. The layout is created by converting the circuit elements specified during the synthesis operation into geometries. A placer performs a placement operation. Specifically, the placer identifies the position of geometries (e.g., circuit modules geometries) on the layout. In some embodiments, the goal of the placer is to position the geometries on the layout in view of certain objective functions or design criteria, such as occupying a minimum area. In some embodiments, the placer performs this operation based on information contained in the design file (e.g., LEF/DEF file), which contains information regarding the physical design of the IC.

As further shown in FIG. 40, the operation after the placement operation 4010 in the process 4000 is a global routing operation 4015. The global routing operation 4015 is performed after the placer has positioned the geometries on the layout. A router performs the global routing operation 4015. During the global routing operation 4015, the router specifies different regions in the routing space through which a wire should be routed. In some embodiments, the router completes the connection between blocks of the circuit, while disregarding the exact geometric details of each wire or pin.

As shown in FIG. 40, the detailed routing operation 4020 follows the global routing operation 4015. A router also performs the detailed routing operation 4020. In some embodiments, the router defines routes that connect the routable elements (e.g., pins) of nets in the layout. The router defines such a route in view of certain objective functions or design criteria, such as minimizing wirelength, minimizing congestion, etc. As previously mentioned, in some embodiments, the router performs this detailed routing operation 4020 based on information contained in the design file (e.g., LEF/DEF file).

To facilitate the creation of the routes with different widths in different directions on the same layer, some embodiments adaptively define the shape of interconnect-line ends (i.e., the shape of the route-segment ends) on a particular layer based on the routing directions available on the particular layer. By so defining these shapes, these embodiments improve the alignment of route segments that have differing widths. In other words, dynamically defining the interconnect-line ends improves the shape of a route at bends along which the route transitions from one width to another.

Also, to facilitate the creation of routes with different widths and/or spacing in different directions on a particular layer, some embodiments define, for each available routing direction on the particular layer, an "unroutable" bloated region about a previously defined geometry (e.g., a previously defined obstacle, wire, or via pad) on the particular layer. An item's bloated region for a particular routing direction specifies the portion of the particular layer that is not available for route segments along the particular routing direction. The item's bloated region for a particular direction is derived based on the minimum spacing required between the item and any route segment in the particular direction for the particular net.

These embodiments then use the bloated regions to figure out which portion of the layout is not available for routing. For instance, some embodiments perform one or more path searches to identify a route for a net. In these embodiments, a path search identifies a path from a source set of grid points to a target set of grid points by iteratively identifying path expansions, where each expansion is from a start grid point to a destination grid point. For each path expansion that goes from a particular start point to a particular destination point along a particular direction, these embodiments determine whether the destination point falls within the bloated region of the particular direction. If so, the destination point is not a valid destination point and the path expansion is not a valid expansion.

This and other routing operations are described in detail in U.S. patent application Ser. No. 10/229,202, filed Aug. 26, 2002, entitled "LAYOUTS WITH ROUTES WITH DIFFERENT WIDTHS IN DIFFERENT DIRECTIONS ON THE SAME LAYER, AND METHOD AND APPARATUS FOR GENERATING SUCH LAYOUTS," now issued as U.S. Pat. No. 7,096,449 and U.S. patent application Ser. No. 10/751,332 filed Jan. 2, 2004, entitled "METHOD AND APPARATUS FOR ROUTING," now issued as U.S. Pat. 7,197,738. U.S. patent application Ser. No. 10/229,202, now issued as U.S. Pat. 7,096,449 and U.S. patent application Ser. No. 10/751,332, now issued as U.S. Pat. No. 7,197,738 are incorporated herein by reference.

As shown in FIG. 40, the design rule checking and extraction-verification operations 4025 follow the detailed routing operation 4020 in the process 4000. In some embodiments, the design rule checking operation is performed by a design rule checker ("DRC"). The DRC verifies that all geometries on the layout meet certain design rules (e.g., dimensional attributes of routes). For instance, the DRC may check that the separation between wires is consistent with the specified designs. The DRC may also check that the width and/or spacing of the routes meet the design rules. In some embodiments, these design rules are located in a design file (e.g., rule deck file). In some embodiments, these design rules are defined during the selection (at 2410) of process 2400. Once the DRC has verified that all the design rules are met, some embodiments extract resistance and capacitance information from the layout, and use the extracted information to verify that the design of the IC meets certain operational requirements. The extracted information can be verified by comparing them to a design file (e.g., LVS file, RCX file). In some embodiments, these requirements include performance objectives and physical constraints. For example, the information that is extracted is used to verify the functionality of the layout (i.e., to verify that the circuit performs as designed).

Some embodiments might perform several iterations of the synthesis, placement, global routing, detailed routing, DRC and extraction-verification operations in order to design the IC. These iterations might be performed within each operation and/or between different operations. During these iterations, various configurations and designs are specified by the synthesis, placement, global routing, detailed routing, DRC and extraction-verification operations in order to achieve an optimal IC design.

D. Manufacturing Integrated Circuits

Figure 41:
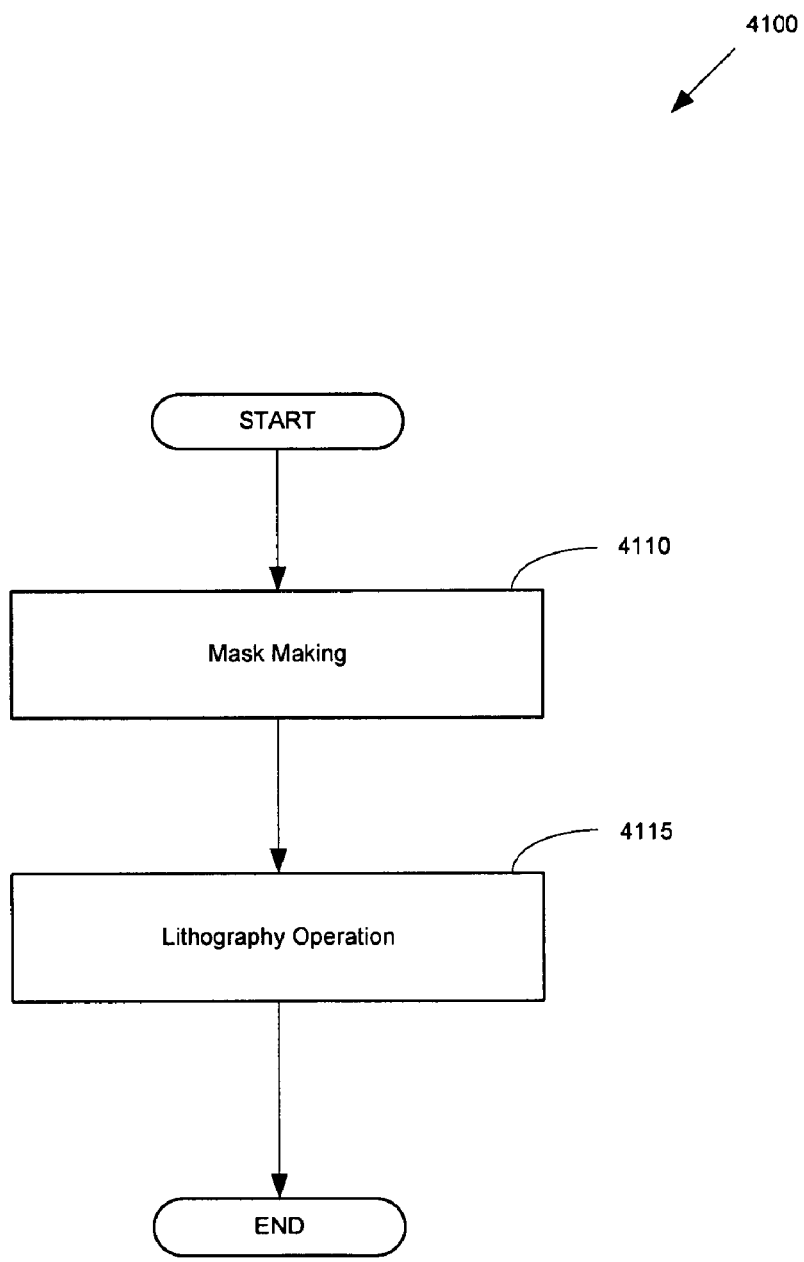
FIG. 41 illustrates a process of manufacturing an IC.

FIG. 41 illustrates a process 4100 for manufacturing an IC. A mask making operation 4110 is the initial operation of the manufacturing process 4100. This mask making operation 4110 creates one or more photo-lithographic masks for each layer of the designed layout of the IC. The mask defines certain components or interconnects of a layer of the IC. As such, for each particular layer, one or more masks are used to define the components or interconnect on that particular layer. Furthermore, each particular mask is based on a layer of the IC layout designed during the design operation 2415 of the process 2400.

As further shown in FIG. 41, a lithography operation 4115 follows the mask making operation 4110 in the manufacturing process 4100. In some embodiments, this lithography operation 4115 uses a light source and a set of lenses to shine light onto a wafer through one or more made masks in order to create components and/or interconnects of the IC.

The above described lithography process 400 of FIG. 4 can be used during the lithography operation 4115. As previously described, the lithography process 400 entails an illumination operation 415, which illuminates a mask and exposes a light pattern onto a wafer based on a specified illumination configuration. The illumination configuration can be manually set for each particular layer. For instance, when illuminating a mask for a particular layer, a technician can insert the appropriate stepper lens for the particular layer in an otherwise fixed illumination configuration. Alternatively, the illumination configuration can be automatically set for each particular layer. For example, when illuminating a mask for a particular layer, an automated machine can insert the appropriate stepper lens for the particular layer.

In some embodiments, the manufacturing process 4100 does not require a mask (i.e., maskless manufacturing process). Thus, in some embodiments the manufacturing process 4100 does not perform the mask making operation 4110 when a mask is not required. A Deep-Ultraviolet lithography ("DUVL") process and an Extreme-Ultraviolet lithography ("EUVL") process are examples of manufacturing processes that might not require a mask. These manufacturing processes might not require a mask because the wavelength of the light that illuminates the wafer is typically smaller than the size of the IC components.

E. Variable Minimum Width and Minimum Spacing

In the above description, a fixed minimum width and/or minimum spacing is defined for each particular direction of each layer of the IC layout. However, in some embodiments, for each particular direction of each layer of the IC layout, there can be multiple minimum width and/or minimum spacing. In such instances, for a particular direction on a layer of the IC layout, different regions of the IC layout will be defined different minimum width and/or minimum spacing. These variations in minimum width and/or minimum spacing apply to certain areas of the IC layout. In some embodiments, these variations in minimum width and/or minimum spacing are based on several manufacturing and/or design factors.

One possible manufacturing factor to consider is the yield of a manufacturing process. A manufacturing yield is the production of a certain amount of non-defective ICs for a given amount of input. Generally speaking, the manufacturing yield progressively gets worse as the minimum width and minimum spacing is reduced. Thus, IC designs that require very small minimum width and minimum spacing will result in lower manufacturing yields than IC designs that have larger minimum width and minimum spacing. Therefore, in some embodiments, defining the minimum width and minimum spacing of a wire will not only depend on the type of stepper lens used, but also on the manufacturing yield that is desired for a particular IC design. In such cases, some embodiments incrementally increase the defined minimum width and/or minimum spacing for each incremental increase in the desired manufacturing yield. Conversely, some embodiments incrementally decrease the defined minimum width and/or minimum spacing for each incremental decrease in the desired manufacturing yield.

In some embodiments, the illumination configuration that includes a particular stepper lens can produce wires that are less than the minimum width and/or minimum spacing for certain regions of the IC, but not the entire IC. In such a case, some embodiments define a secondary minimum width and/or secondary minimum spacing for one or more regions of the IC that is less than the minimum width and/or minimum spacing of wires for the layer of the IC. Such a secondary minimum width and/or secondary minimum spacing may be required when the design of an IC requires the addition of at least one more wire in region of the IC layout (e.g., increase congestion for certain areas of the IC layout).

Thus, in some embodiments the use of variable minimum width and/or minimum spacing for a particular layer of the IC reflects a balance of a cost and benefit analysis of using a particular minimum width and/or minimum spacing in certain regions of the IC.

III. Computer System

Figure 42:
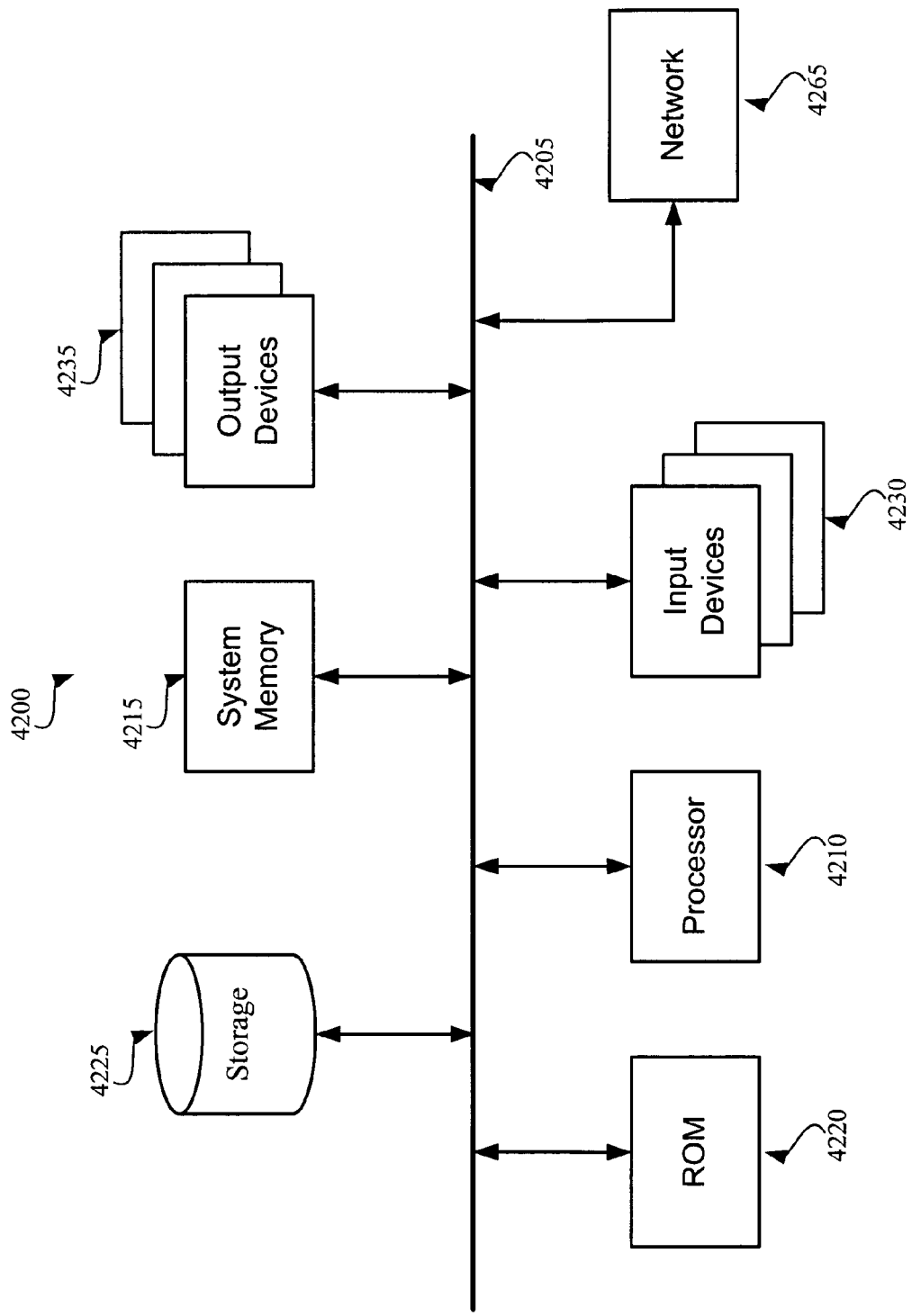
FIG. 42 illustrates a computer system with which some embodiments of the invention is implemented.

FIG. 42 conceptually illustrates a computer system with which some embodiments of the invention is implemented. Computer system 4200 includes a bus 4205, a processor 4210, a system memory 4215, a read-only memory 4220, a permanent storage device 4225, input devices 4230, and output devices 4235.

The bus 4205 collectively represents all system, peripheral, and chipset buses that support communication among internal devices of the computer system 4200. For instance, the bus 4205 communicatively connects the processor 4210 with the read-only memory 4220, the system memory 4215, and the permanent storage device 4225.

From these various memory units, the processor 4210 retrieves instructions to execute and data to process in order to execute the processes of the invention. The read-only-memory (ROM) 4220 stores static data and instructions that are needed by the processor 4210 and other modules of the computer system. The permanent storage device 4225, on the other hand, is a read-and-write memory device. This device is a non-volatile memory unit that stores instruction and data even when the computer system 4200 is off. Some embodiments of the invention use a mass-storage device (such as a magnetic or optical disk and its corresponding disk drive) as the permanent storage device 4225. Other embodiments use a removable storage device (such as a floppy disk or Zip® disk, and its corresponding disk drive) as the permanent storage device.

Like the permanent storage device 4225, the system memory 4215 is a read-and-write memory device. However, unlike storage device 4225, the system memory is a volatile read-and-write memory, such as a random access memory. The system memory stores some of the instructions and data that the processor needs at runtime. In some embodiments, the invention's processes are stored in the system memory 4215, the permanent storage device 4225, and/or the read-only memory 4220.

The bus 4205 also connects to the input and output devices 4230 and 4235. The input devices enable the user to communicate information and select commands to the computer system. The input devices 4230 include alphanumeric keyboards and cursor-controllers. The output devices 4235 display images generated by the computer system. The output devices include printers and display devices, such as cathode ray tubes (CRT) or liquid crystal displays (LCD).

Finally, as shown in FIG. 42, bus 4205 also couples computer 4200 to a network 4265 through a network adapter (not shown). In this manner, the computer can be a part of a network of computers (such as a local area network ("LAN"), a wide area network ("WAN"), or an Intranet) or a network of networks (such as the Internet). Any or all of the components of computer system 4200 may be used in conjunction with the invention. However, one of ordinary skill in the art will appreciate that any other system configuration may also be used in conjunction with the invention.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed is:

1. A manufacturing aware process for designing an integrated circuit ("IC") layout, the process comprising:
specifying a stepper lens for a particular layer of the IC layout as part of an illumination configuration;
at a computing device, defining a wiring configuration based on the illumination configuration; and
using the defined wiring configuration to route the IC layout.

2. The process of claim 1, wherein defining the wiring configuration comprises defining a first width for a first route and a second width for a second route for each layer of the IC layout based on the specified stepper lens.

3. The process of claim 1, wherein specifying the stepper lens comprises specifying at least one of an octagonal lens and an annular lens for a first the particular layer of the IC layout.

4. A manufacturing aware process for designing an integrated circuit ("IC") layout, the process comprising:
specifying a dipole lens for a first layer of the IC layout as part of an illumination configuration, wherein the dipole lens comprises two poles;
at a computing device, defining a wiring configuration based on the illumination configuration; and
using the defined wiring configuration to route the IC layout.

5. The process of claim 4, wherein defining the wiring configuration comprises defining a narrow route in a first direction and a wide route in a second direction different from the first direction for the first layer of the IC layout when the two poles of the dipole lens are aligned in a direction that is perpendicular to the first direction.

6. The process of claim 5, wherein the first direction is a horizontal direction when the two poles of the dipole lens are vertically aligned.

7. The process of claim 5, wherein the first direction is a vertical direction when the two poles of the dipole lens are horizontally aligned.

8. The process of claim 5, wherein the first direction is a 135° diagonal direction when the two poles of the dipole lens are 45° diagonally aligned.

9. The process of claim 5, wherein the first direction is a 45° diagonal direction when the two poles of the dipole lens are 135° diagonally aligned.

10. The process of claim 4, wherein the dipole lens is a first dipole lens, wherein the process further comprises specifying a second dipole lens for the first layer of the IC layout, the second dipole lens comprises two poles.

11. The process of claim 10, wherein defining the wiring configuration comprises defining a narrow route in a first direction, a narrow route in a second direction, and a wide route in a third direction different from the first and second directions for the first layer of the IC layout when the two poles of the first dipole lens are aligned in a direction that is perpendicular to the first direction and the two poles of the second dipole lens are aligned in a direction that is perpendicular to the second direction.

12. The process of claim 11, wherein the first direction is a horizontal direction when the two poles of the first dipole lens are vertically aligned, and the second direction is a vertical direction when the two poles of the second dipole lens are horizontally aligned.

13. The process of claim 11, wherein the first direction is a 135° diagonal direction when the two poles of the first dipole lens are 45° diagonally aligned, and the second direction is a 45° diagonal direction when the two poles of the second dipole lens are 135° diagonally aligned.

14. The process of claim 4, wherein the poles of the dipole lens comprise at least one of a circular shape, a non-circular shape, and an elliptical shape.

15. A manufacturing aware process for designing an integrated circuit ("IC") layout, the process comprising:
  specifying a quadrupole lens for a first layer of the IC layout as part of an illumination configuration, wherein the quadrupole lens comprises four poles;
  at a computing device, defining a wiring configuration based on the illumination configuration; and
  using the defined wiring configuration to route the IC layout.

16. The process of claim 15, wherein defining the wiring configuration comprises defining a narrow route in a first direction, a narrow route in a second direction, and a wide route in a third direction different from the first and second directions for the first layer of the IC layout when the first and second poles of the quadrupole lens are aligned in a direction that is perpendicular to the first direction, and the third and fourth poles of the quadrupole lens are aligned in a direction that is perpendicular to the second direction.

17. The process of claim 16, wherein the first direction is a horizontal direction when the first and second poles of the quadrupole lens are vertically aligned, and the second direction is a vertical direction when the third and fourth poles of the quadrupole lens are horizontally aligned.

18. The process of claim 16, wherein the first direction is a 135° diagonal direction when the first and second poles of the quadrupole lens are 45° diagonally aligned, and the second direction is a 45° diagonal direction when the third and fourth poles of the quadrupole lens are 135° diagonally aligned.

19. A manufacturing aware process for designing an integrated circuit ("IC") layout, the process comprising:
  specifying an off-axis illumination configuration for the IC layout;
  at a computing device, defining a wiring configuration based on the specified illumination configuration; and
  using the defined wiring configuration to route the IC layout.

20. The process of claim 19, wherein the specified off-axis illumination configuration comprises a lens and a light source that strikes a surface of the lens not at a perpendicular angle.

21. The process of claim 19, wherein defining the wiring configuration comprises defining a first width for a first route and a second width for a second route for each layer of the IC layout based on the specified off-axis illumination configuration.

22. The process of claim 19, wherein defining the wiring configuration comprises:
  identifying a first spacing constraint for routes in a first plurality of routes along a first direction of a first layer of the IC layout; and
  identifying a second spacing constraint for routes in a second plurality of routes along a second direction of the first layer of the IC layout.

23. The process of claim 22, wherein the first spacing constraint is narrower than the second spacing constraint.

24. A non-transitory computer readable medium storing a computer program for execution by at least one processor, the computer program for designing an integrated circuit ("IC") layout, the computer program comprising sets of instructions for:
  specifying a stepper lens for a particular layer of the IC layout as part of an illumination configuration;
  defining a wiring configuration based on the illumination configuration; and
  using the defined wiring configuration to route the IC layout.

25. The non-transitory computer readable medium of claim 24, wherein the specified stepper lens is one of a dipole lens and a quadrupole lens.

26. The non-transitory computer readable medium of claim 24, wherein the set of instructions for defining the wiring configuration comprises a set of instructions for defining a first width for a first route and a second width for a second route for at least one layer of the IC layout based on the specified stepper lens.

27. The non-transitory computer readable medium of claim 24, wherein the specified stepper lens is a quadrupole lens comprising four poles, wherein the set of instructions for defining the wiring configuration comprises a set of instructions for defining a narrow route in a first direction, a narrow route in a second direction, and a wide route in a third direction different from the first and second directions for the IC layout when the first and second poles of the quadrupole lens are aligned in a direction that is perpendicular to the first direction, and the third and fourth poles of the quadrupole lens are aligned in a direction that is perpendicular to the second direction.

28. The non-transitory computer readable medium of claim 24, wherein the specified stepper lens is a dipole lens comprising two poles, wherein the set of instructions for defining the wiring configuration comprises a set of instructions for defining a narrow route in a first direction and a wide route in a second direction different from the first direction for the IC layout when the two poles of the dipole lens are aligned in a direction that is perpendicular to the first direction.

29. The non-transitory computer readable medium of claim 28, wherein the first direction is a horizontal direction when the two poles of the dipole lens are vertically aligned.

30. The non-transitory computer readable medium of claim 28, wherein the first direction is a 135° diagonal direction when the two poles of the dipole lens are 45° diagonally aligned.

31. A system comprising:
- at least one processor for executing sets of instructions; and
- a memory storing a computer program for designing an integrated circuit ("IC") layout, the computer program comprising sets of instructions to be executed in the processor for:
  - specifying an off-axis illumination configuration for the IC layout;
  - defining a wiring configuration based on the specified illumination configuration; and
  - using the defined wiring configuration to route the IC layout.

32. The system of 31, wherein the specified off-axis illumination configuration comprises a lens and a light source that strikes a surface of the lens not at a perpendicular angle.

33. The system of 31, wherein the set of instructions for defining the wiring configuration comprises a set of instructions for defining a first width for a first route and a second width for a second route for each layer of the IC layout based on the specified off-axis illumination configuration.

34. The system of 31, wherein the set of instructions for defining the wiring configuration comprises sets of instructions for:
- identifying a first spacing constraint for routes in a first plurality of routes along a first direction of a first layer of the IC layout; and
- identifying a second spacing constraint for routes in a second plurality of routes along a second direction of the first layer of the IC layout.

* * * * *